US012195853B2

(12) United States Patent
Takebayashi et al.

(10) Patent No.: US 12,195,853 B2
(45) Date of Patent: Jan. 14, 2025

(54) SUBSTRATE PROCESSING APPARATUS, METHOD OF MANUFACTURING SEMICONDUCTOR DEVICE, SUBSTRATE PROCESSING METHOD, AND RECORDING MEDIUM

(71) Applicant: KOKUSAI ELECTRIC CORPORATION, Tokyo (JP)

(72) Inventors: Motonari Takebayashi, Toyama (JP); Hiroshi Nakajo, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 0 days.

(21) Appl. No.: 17/476,211

(22) Filed: Sep. 15, 2021

(65) Prior Publication Data

US 2022/0081770 A1    Mar. 17, 2022

(30) Foreign Application Priority Data

Sep. 17, 2020  (JP) ................................ 2020-156802

(51) Int. Cl.
   *C23C 16/455*    (2006.01)
   *B05C 11/10*     (2006.01)
   (Continued)

(52) U.S. Cl.
   CPC .... *C23C 16/45561* (2013.01); *B05C 11/1013* (2013.01); *C23C 16/52* (2013.01); *H01L 21/28568* (2013.01); *H01L 21/67017* (2013.01)

(58) Field of Classification Search
   CPC ... C23C 16/45561; C23C 16/52; C23C 16/08; C23C 16/45544; C23C 16/45578;
   (Continued)

(56) References Cited

U.S. PATENT DOCUMENTS 6,098,964 A  *  8/2000  Schmitt ................. C23C 16/448
                                                   118/726
2003/0010091 A1    1/2003  Mitchell
(Continued)

FOREIGN PATENT DOCUMENTS

JP    H11-063400 A    3/1999
JP    H11-236673 A    8/1999
(Continued)

OTHER PUBLICATIONS

Singapore Search Report issued on Dec. 6, 2022 for Singapore Patent Application No. 10202110237S.
(Continued)

*Primary Examiner* — Yewebdar T Tadesse
(74) *Attorney, Agent, or Firm* — Volpe Koenig

(57) ABSTRACT

There is provided a technique that includes: a reaction container configured to accommodate a substrate; an exhaust pipe configured to exhaust an atmosphere inside the reaction container; a gas supplier configured to supply a process gas to the substrate; a gas supply system including at least one gas supply pipe kept in fluid communication with the gas supplier and configured to supply the process gas, a plurality of valves provided on the at least one gas supply pipe, and a plurality of pressure detectors provided between the plurality of valves; and a controller configured to be capable of determining a blockage level of the at least one gas supply pipe based on at least one pressure among measurement results of the plurality of pressure detectors.

19 Claims, 14 Drawing Sheets

(51) Int. Cl.
*C23C 16/52* (2006.01)
*H01L 21/285* (2006.01)
*H01L 21/67* (2006.01)

(58) Field of Classification Search
CPC .............. C23C 16/4412; C23C 16/455; H01L 21/28568; H01L 21/67017; H01L 21/28079; H01L 21/67253; H01L 21/67276
USPC .......... 156/345.26, 345.27, 345.37; 118/724, 118/692
See application file for complete search history.

(56) References Cited

U.S. PATENT DOCUMENTS

| | | | |
|---|---|---|---|
| 2004/0163590 A1* | 8/2004 | Tran | C23C 16/52 118/715 |
| 2007/0269596 A1* | 11/2007 | Shero | C23C 16/52 427/248.1 |
| 2008/0208385 A1* | 8/2008 | Sakamoto | C23C 16/4412 700/121 |
| 2009/0192652 A1* | 7/2009 | Yamada | H01L 21/67109 700/282 |
| 2011/0100483 A1 | 5/2011 | Nagata et al. | |
| 2016/0056044 A1* | 2/2016 | Harada | C23C 16/34 438/763 |
| 2018/0253111 A1* | 9/2018 | Goto | G01F 15/005 |

FOREIGN PATENT DOCUMENTS

| | | |
|---|---|---|
| JP | 2003-190761 A | 7/2003 |
| JP | 2009-176982 A | 8/2009 |
| JP | 2009-252760 A | 10/2009 |
| JP | 2011-118654 A | 6/2011 |
| JP | 2013-008978 A | 1/2013 |
| KR | 10-2018-0059786 A | 6/2018 |

OTHER PUBLICATIONS

Singapore Written Opinion issued on Dec. 8, 2022 for Singapore Patent Application No. 10202110237S.
Korean Office Action dated Jun. 29, 2023 for Korean Patent Application No. 10-2021-0123087.
Taiwan Office Action issued on Apr. 18, 2024 for Taiwan Patent Application No. 110133677.

* cited by examiner

| Blockage level | Response program | Program outline |
|---|---|---|
| 1 | PA | Alarm notification |
| 2 | PB | Supply pipe heating |
| 3 | PC | Supply pipe replacement preparation |

122

Determination level: determination level 1

Response program : PA(alarm notification)

Upstream side ← A → Downstream side

HTPi (i=1~8)

SUBSTRATE PROCESSING APPARATUS, METHOD OF MANUFACTURING SEMICONDUCTOR DEVICE, SUBSTRATE PROCESSING METHOD, AND RECORDING MEDIUM

CROSS-REFERENCE TO RELATED APPLICATION

This application is based upon and claims the benefit of priority from Japanese Patent Application No. 2020-156802, filed on Sep. 17, 2020, the entire contents of which are incorporated herein by reference.

TECHNICAL FIELD

The present disclosure relates to a substrate processing apparatus, a method of manufacturing a semiconductor device, a substrate processing method, and a recording medium.

BACKGROUND

It is known that in a substrate processing apparatus for forming a film on a substrate, liquid or solid deposits in a gas pipe clog a pipe, a valve or the like, which requires regular maintenance.

A gas supply pipe is configured to be heated by a heater or the like so that a precursor does not solidify and adhere to the gas supply pipe. However, the precursor may solidify and adhere to the gas supply pipe, and the gas supply pipe may be blocked. In this case, it is necessary to identify a blocked portion by determining which of the portion of the gas supply pipe is blocked. If the blocked portion cannot be identified, it is necessary to perform a replacement operation that replaces the gas supply pipe considered to be blocked. If the time required for identifying the blocked portion and performing the replacement operation becomes long, the time for eliminating the blockage of the gas supply pipe becomes long, and the downtime of the substrate processing apparatus becomes long. As a result, the manufacturing throughput of the substrate processing apparatus is reduced.

SUMMARY

Some embodiments of the present disclosure provide a technique capable of shortening the time required for eliminating blockage of a gas supply pipe and improving the manufacturing throughput of a substrate processing apparatus. Other objects and novel features will become apparent from the description of through subject specification and the accompanying drawings.

The following is a brief overview of the representative one of the present disclosure.

According to one or more embodiments of the present disclosure, there is provided a technique that includes: a reaction container configured to accommodate a substrate; an exhaust pipe configured to exhaust an atmosphere inside the reaction container; a gas supplier configured to supply a process gas to the substrate; a gas supply system including at least one gas supply pipe kept in fluid communication with the gas supplier and configured to supply the process gas, a plurality of valves provided on the at least one gas supply pipe, and a plurality of pressure detectors provided between the plurality of valves; and a controller configured to be capable of determining a blockage level of the at least one gas supply pipe based on at least one pressure among measurement results of the plurality of pressure detectors.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
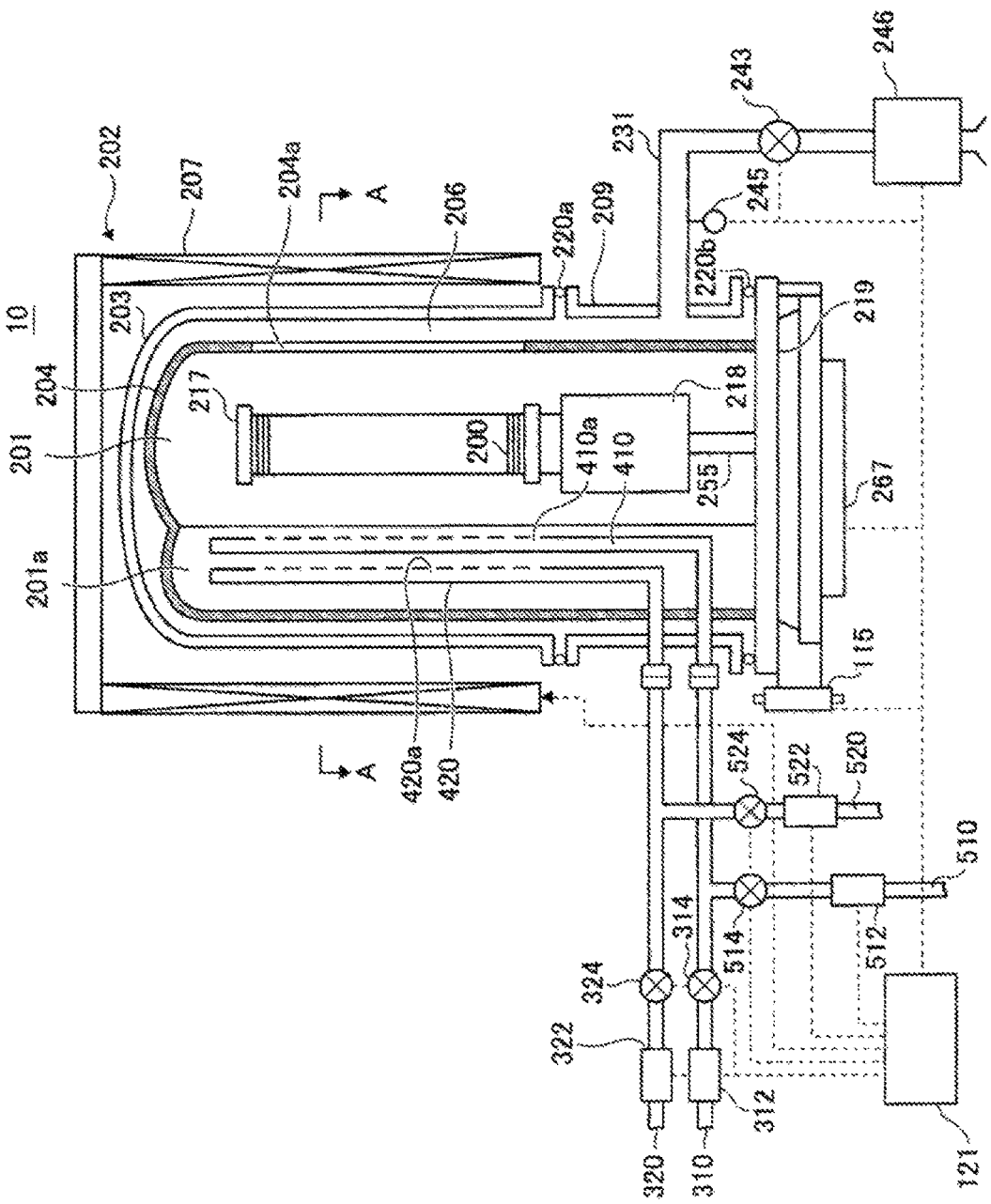
FIG. 1 is an oblique perspective view of a substrate processing apparatus preferably used in one embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described with reference to the drawings. In the following description, the same components may be designated by like reference numerals and the repeated description thereof may be omitted. As compared with actual embodiments, the drawings may be represented schematically in order to clarify the description. However, the drawings are nothing more than examples and do not limit the interpretation of the present disclosure. Further, the dimensional relationship of respective components, the ratio of respective components, and the like shown in the drawings do not always match the actual ones. In addition, the dimensional relationship of respective components, the ratio of respective components, and the like do not always match between the drawings.

Embodiments (1) Configuration of Substrate Processing Apparatus

The substrate processing apparatus 10 includes a process furnace 202 provided with a heater 207 as a heating means (heating mechanism or heating system). The heater 207 has a cylindrical shape, and is vertically installed by being supported on a heater base (not shown) as a holding plate.

Inside the heater 207, there is installed an outer tube 203 which constitutes a reaction container (process container) concentrically with the heater 207. The outer tube 203 is made of, for example, a heat-resistant material such as quartz ($SiO_2$) or silicon carbide (SiC), and is formed in a cylindrical shape having a closed upper end and an open lower end. Below the outer tube 203, there is installed a manifold (inlet flange) 209 concentrically with the outer tube 203. The manifold 209 is made of, for example, a metal such as stainless steel (SUS) or the like. The manifold 209 is formed in a cylindrical shape having open upper and lower ends. An O-ring 220a as a seal is installed between the upper end of the manifold 209 and the outer tube 203. As the manifold 209 is supported by the heater base, the outer tube 203 comes into a vertically installed state.

Inside the outer tube 203, there is installed an inner tube 204 that constitutes a reaction container. The inner tube 204 is made of a heat-resistant material such as quartz ($SiO_2$) or silicon carbide (SiC), and is formed in a cylindrical shape having a closed upper end and an open lower end. A process container (reaction container) is mainly constituted by the outer tube 203, the inner tube 204 and the manifold 209. A process chamber (reaction chamber) 201 is formed in a hollow of the process container (inside the inner tube 204).

The process chamber 201 is configured to be capable of accommodating wafers 200 as substrates in a state in which the wafers 200 are arranged in multiple stages in a vertical direction in a horizontal posture by a boat 217 described later.

In the process chamber 201, nozzles 410 and 420 are provided so as to penetrate a side wall of the manifold 209 and the inner tube 204. Gas supply pipes 310 and 320 are connected to the nozzles 410 and 420, respectively. However, the process furnace 202 of the present embodiment is not limited to the above-described form.

Mass flow controllers (MFCs) 312 and 322, which are flow rate controllers (flow rate control parts), and valves 314 and 324, which are opening/closing valves, are respectively installed on the gas supply pipes 310 and 320 sequentially from the upstream side. Gas supply pipes 510 and 520 for supplying an inert gas are connected to the gas supply pipes 310 and 320 on the downstream side of the valves 314 and 324, respectively. MFCs 512 and 522, which are flow rate controllers (flow rate control parts), and valves 514 and 524, which are opening/closing valves, are respectively installed on the gas supply pipes 510 and 520 sequentially from the upstream side.

Nozzles 410 and 420 are connected to the distal ends of the gas supply pipes 310 and 320, respectively. The nozzles 410 and 420 are configured as L-shaped nozzles. The horizontal portions of the nozzles 410 and 420 are installed to penetrate the side wall of the manifold 209 and the inner tube 204. The vertical portions of the nozzles 410 and 420 are installed inside a channel-shaped (groove-shaped) spare chamber 201a that protrudes radially outward of the inner tube 204 and extends in the vertical direction. In the spare chamber 201a, the vertical portions of the nozzles 410 and 420 are installed to extend upward (upward in the arrangement direction of the wafers 200) along the inner wall of the inner tube 204.

The nozzles 410 and 420 are installed so as to extend from a lower region of the process chamber 201 to an upper region of the process chamber 201. The nozzles 410 and 420 have a plurality of gas supply holes 410a and 420a, respectively, which are formed at positions facing the wafers 200. Thus, process gases are supplied to the wafers 200 from the gas supply holes 410a and 420a of the nozzles 410 and 420, respectively. The gas supply holes 410a and 420a are formed over a region from the lower portion to the upper portion of the inner tube 204. The gas supply holes 410a and 420a have the same opening area, and are provided at the same opening pitch. However, the gas supply holes 410a and 420a are not limited to the above-described form. For example, the opening area may be gradually increased from the lower portion to the upper portion of the inner tube 204. By doing so, the flow rates of the gases supplied from the gas supply holes 410a and 420a can be made more uniform.

The gas supply holes 410a and 420a of the nozzles 410 and 420 are formed at height positions from the bottom to the top of the boat 217, which will be described later. Therefore, the process gases supplied into the process chamber 201 from the gas supply holes 410a and 420a of the nozzles 410 and 420 are supplied to the entire arrangement region of the wafers 200 accommodated from the lower portion to the upper portion of the boat 217. The nozzles 410 and 420 may be installed so as to extend from the lower region to the upper region of the process chamber 201, but are preferably installed so as to extend to the vicinity of the ceiling of the boat 217.

From the gas supply pipe 310, a precursor gas as a process gas is supplied into the process chamber 201 via the MFC 312, the valve 314 and the nozzle 410. As the precursor gas, a molybdenum (Mo)-containing gas containing molybdenum (Mo) and oxygen (O) may be used. As the Mo-containing gas, for example, a molybdenum dichloride ($MoO_2Cl_2$) gas or a molybdenum tetrachloride ($MoOCl_4$) gas may be used. The precursor is in a solid state at the room temperature and the atmospheric pressure.

From the gas supply pipe 320, a reducing gas as a process gas is supplied into the process chamber 201 via the MFC 322, the valve 324 and the nozzle 420. As the reducing gas, for example, a hydrogen (H2) gas, which is a hydrogen (H)-containing gas, may be used.

From the gas supply pipes 510 and 520, for example, an argon (Ar) gas, which is a rare gas, is supplied as an inert gas into the process chamber 201 via the MFCs 512 and 522, the valves 514 and 524, and the nozzles 410 and 420, respectively. Hereinafter, an example in which the Ar gas is used as the inert gas will be described. As the inert gas, for example, a rare gas such as a helium (He) gas, a neon (Ne) gas, a xenon (Xe) gas or the like may be used in addition to the Ar gas.

A process gas supply system is mainly constituted by the gas supply pipes 310 and 320, the MFCs 312 and 322, the valves 314 and 324, and the nozzles 410 and 420. However, only the nozzles 410 and 420 may be considered as the process gas supply system. The process gas supply system may be simply referred to as gas supply system. When the Mo-containing gas is allowed to flow from the gas supply pipe 310, a Mo-containing gas supply system is mainly constituted by the gas supply pipe 310, the MFC 312, and the valve 314. The nozzle 410 may be included in the Mo-containing gas supply system. Further, when the reducing gas is allowed to flow from the gas supply pipe 320, a reducing gas supply system is mainly constituted by the gas supply pipe 320, the MFC 322, and the valve 324. The nozzle 420 may be included in the reducing gas supply system. In addition, an inert gas supply system is mainly constituted by the gas supply pipes 510 and 520, the MFCs 512 and 522, and the valves 514 and 524. The inert gas supply system may be referred to as a rare gas supply system.

In the gas supply method according to the present embodiment, the gases are transported via the nozzles 410 and 420 arranged in the spare chamber 201a in an annular vertically-elongated space defined by the inner wall of the inner tube 204 and the end portions of the plurality of wafers 200. The gases are injected into the inner tube 204 from the gas supply holes 410a and 420a formed in the nozzles 410 and 420 at the positions facing the wafers. More specifically, the process gas and the like are injected in a direction parallel to the surfaces of the wafers 200 from the gas supply holes 410a of the nozzle 410 and the gas supply holes 420a of the nozzle 420.

The exhaust hole (exhaust port) 204a is a through-hole formed on the side wall of the inner tube 204 at a position facing the nozzles 410 and 420. The exhaust hole is, for example, a slit-shaped through-hole elongated in the vertical direction. The gas supplied from the gas supply holes 410a and 420a of the nozzles 410 and 420 into the process chamber 201 and flowing on the surfaces of the wafers 200 flows into an exhaust path 206 defined by a gap formed between the inner tube 204 and the outer tube 203 via the exhaust hole 204a. Then, the gas flowing into the exhaust path 206 flows into an exhaust pipe 231 and is discharged out of the process furnace 202.

The exhaust hole 204a is formed at a position facing the plurality of wafers 200. The gas supplied from the gas supply holes 410a and 420a to the vicinity of the wafers 200 in the process chamber 201 flows in the horizontal direction, and then flows into the exhaust path 206 through the exhaust hole 204a. The exhaust hole 204a is not limited to being configured as a slit-shaped through-hole, and may be configured by a plurality of holes.

The manifold 209 is provided with an exhaust pipe 231 for exhausting the atmosphere in the process chamber 201. A pressure sensor 245 as a pressure detector (pressure detection part) for detecting the pressure in the process chamber 201, an APC (Automatic Pressure Controller) valve 243 and a vacuum pump 246 as a vacuum exhaust device are connected to the exhaust pipe 231 sequentially from the upstream side. By opening and closing the APC valve 243 while operating the vacuum pump 246, it is possible to perform evacuation of the process chamber 201 and to stop the evacuation of the process chamber 201. Furthermore, by adjusting the opening degree of the APC valve 243 while operating the vacuum pump 246, it is possible to regulate the pressure in the process chamber 201. An exhaust system is mainly constituted by the exhaust hole 204a, the exhaust path 206, the exhaust pipe 231, the APC valve 243 and the pressure sensor 245. The vacuum pump 246 may be included in the exhaust system.

Below the manifold 209, there is installed a seal cap 219 as a furnace port lid capable of hermetically closing the lower end opening of the manifold 209. The seal cap 219 is configured to make contact with the lower end of the manifold 209 from below in the vertical direction. The seal cap 219 is made of, for example, a metal such as SUS or the like, and is formed in a disk shape. On the upper surface of the seal cap 219, there is installed an O-ring 220b as a seal that makes contact with the lower end of the manifold 209. On the opposite side of the seal cap 219 from the process chamber 201, there is installed a rotator 267 for rotating a boat 217 that accommodates the wafers 200. A rotation shaft 255 of the rotator 267 is connected to the boat 217 through the seal cap 219. The rotator 267 is configured to rotate the boat 217 to rotate the wafers 200. The seal cap 219 is configured to be moved up and down in the vertical direction by a boat elevator 115 as an elevating mechanism installed vertically outside the outer tube 203. The boat elevator 115 is configured to be capable of loading and unloading the boat 217 into and from the process chamber 201 by moving the seal cap 219 up and down. The boat elevator 115 is configured as a transfer device (transfer system) that transfers the boat 217 and the wafers 200 accommodated in the boat 217 into and out of the process chamber 201.

The boat 217 as a primary delivery substrate support is configured to arrange a plurality of, for example, 25 to 200, wafers 200 in a horizontal posture and at intervals in a vertical direction with the centers thereof aligned with each other. The boat 217 is made of, for example, a heat-resistant material such as quartz or SiC. Under the boat 217, heat insulating plates 218 made of, for example, a heat-resistant material such as quartz or Si, are supported in a horizontal posture in multiple stages (not shown). This configuration makes it difficult for the heat from the heater 207 to be transferred toward the seal cap 219. However, the present embodiment is not limited to the above-described form. For example, instead of installing the heat insulating plates 218 under the boat 217, a heat insulating cylinder configured as a cylindrical member made of a heat-resistant material such as quartz or SiC may be installed.

Figure 2:
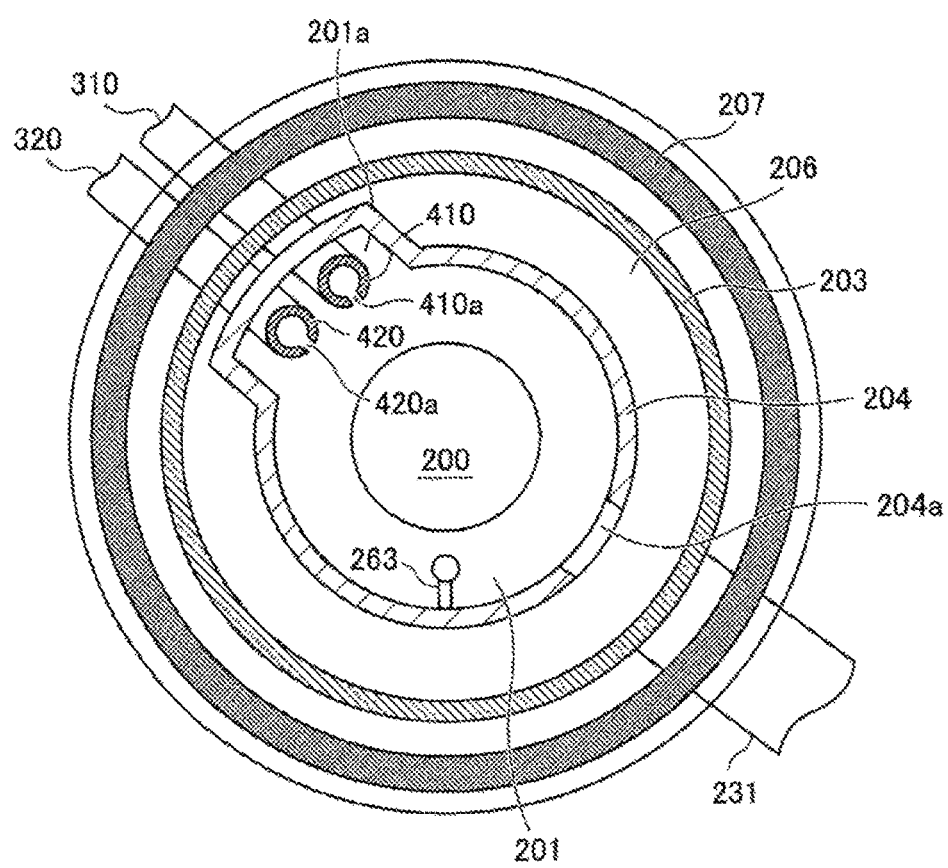
FIG. 2 is a schematic sectional view taken along line A-A in FIG. 1

As shown in FIG. 2, a temperature sensor 263 as a temperature detector is installed in the inner tube 204. By adjusting the supply amount of electricity to the heater 207 based on the temperature information detected by the temperature sensor 263, the inside of the process chamber 201 has a desired temperature distribution. The temperature sensor 263 is formed in an L shape just like the nozzles 410 and 420, and is installed along the inner wall of the inner tube 204.

Figure 3:
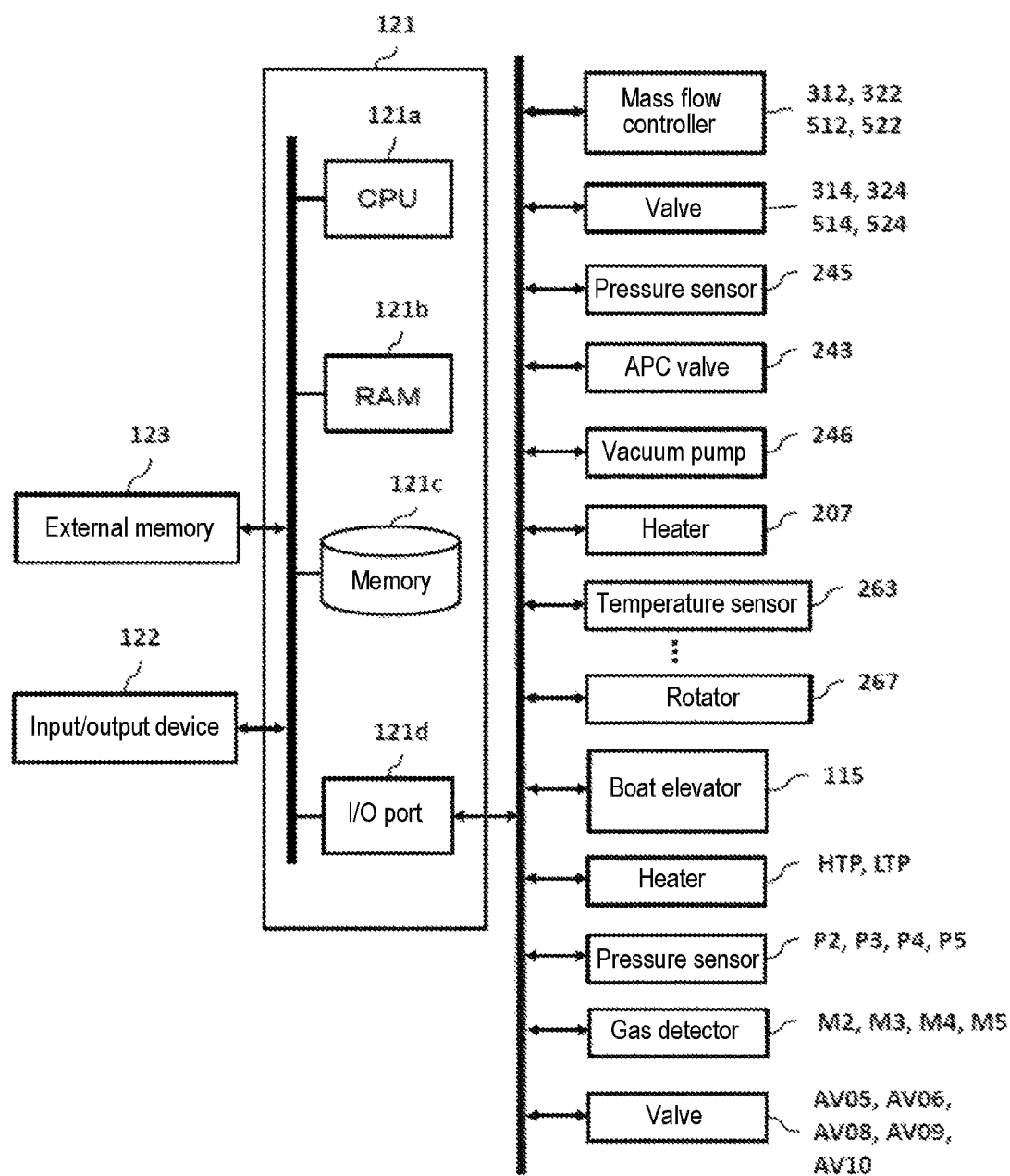
FIG. 3 is a schematic configuration diagram of a controller of the substrate processing apparatus according to one embodiment of the present disclosure, in which a control system of the controller is shown as a block diagram.

As shown in FIG. 3, a controller 121 as a controller (control means) is configured as a computer including a CPU (Central Processing Unit) 121a, a RAM (Random Access Memory) 121b, a memory 121c and an I/O port 121d. The RAM 121b, the memory 121c and the I/O port 121d are configured to exchange data with the CPU 121a via an internal bus. An input/output device 122 configured as, for example, a display device such as a liquid crystal display with a touch panel, or the like is connected to the controller 121.

The memory 121c is configured by, for example, a flash memory, an HDD (Hard Disk Drive) or the like. The memory 121c readably stores a control program for controlling the operation of the substrate processing apparatus, a process recipe in which procedures and conditions of a below-described method of manufacturing a semiconductor device are written, and the like. The process recipe is a combination that can obtain a predetermined result by causing the controller 121 to execute the respective processes (respective steps) in a below-described method of manufacturing a semiconductor. The process recipe functions as a program. Hereinafter, the process recipe, the control program and the like are collectively and simply referred to as a program. As used herein, the term "program" may refer to a case of including only the process recipe, a case of including only the control program, or a case of including a combination of the process recipe and the control program. The RAM 121b is configured as a memory area (work area) in which the program read by the CPU 121a, data, and the like are temporarily held.

The I/O port 121d is configured to be connectable to the MFCs 312, 322, 512, and 522, the valves 314, 324, 514, and 524, the pressure sensor 245, the APC valve 243, the vacuum pump 246, the heater 207, the temperature sensor 263, the rotator 267, the boat elevator 115, the below-described heaters HTP and LTP, the below-described valves AV05, AV06, AV08, AV09 and AV10, the below-described pressure sensors P2, P3, P4 and P5, the below-described gas detectors M2, M3, M4 and M5, and the like. As used herein, the term "connected" may not only means that a certain part is physically connected, but also means that a certain part is configured to be capable of directly or indirectly communicating with another part using electric signals, information and the like.

The CPU 121a is configured to read the control program from the memory device 121c and execute the control program thud read. The CPU 121a is also configured to read the recipe from the memory 121c in response to an operation command inputted from the input/output device 261 or the like. The CPU 121a is configured to control, according to the contents of the recipe thus read, the operation of adjusting the flow rates of various gases by the MFCs 312, 322, 512 and 522, the opening/closing operation of the valves 314, 324, 514 and 524, the opening/closing operation of the APC valve 243, the pressure regulation operation by the APC valve 243 based on the pressure sensor 245, the temperature adjustment operation of the heater 207 based on the temperature sensor 263, the start and stop of the vacuum pump 246, the rotation and rotation speed adjustment operation of the boat 217 by the rotator 267, the operation of raising and lowering the boat 217 by the boat elevator 115, the operation of storing the wafers 200 in the boat 217, the operation of controlling the heating of the gas supply pipe 310 by the heaters HTP and LTP, and the like.

The controller 121 may be configured by installing, in a computer, the aforementioned program stored an external memory (e.g., a magnetic tape, a magnetic disk such as a flexible disk or hard disk, an optical disk such as a CD or a DVD, a magneto-optical disk such as an MO or the like, or a semiconductor memory such as a USB memory or a memory card) 123. The memory 121c and the external memory 123 are configured as computer-readable recording media. Hereinafter, the memory 121c and the external memory 123 are collectively and simply referred to as a recording medium. As used herein, the term "recording medium" may refer to a case of including only the memory 121c, a case of including only the external memory 123, or a case of including both the memory 121c and the external memory 123. The provision of the program to the computer may be performed using a communication means such as the Internet or a dedicated line without having to use the external memory 123.

(2) Substrate Processing Process

Figure 4:
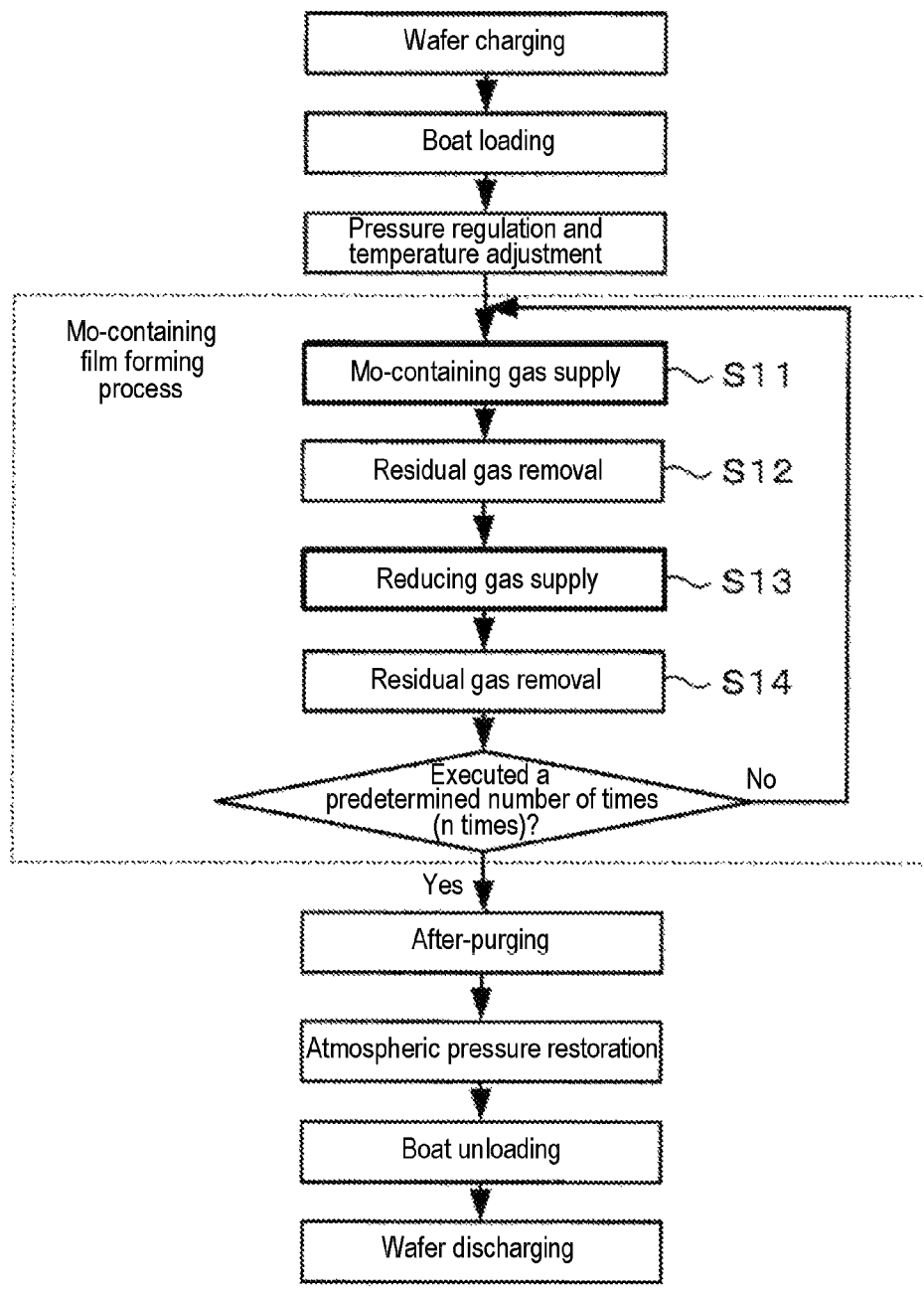
FIG. 4 is a diagram showing a substrate processing process according to one embodiment of the present disclosure.
Figure 5:
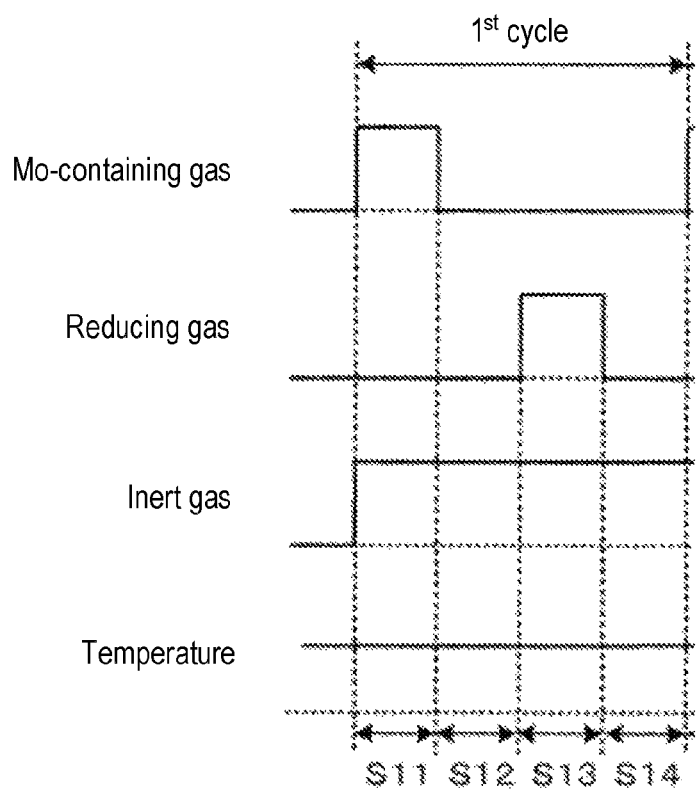
FIG. 5 is a diagram showing a Mo-containing film forming process in the substrate processing process shown in FIG. 4.

As one of processes of manufacturing a semiconductor device, an example of a process of forming a Mo-containing film containing molybdenum (Mo) and used as, for example, a control gate electrode of a 3D NAND, on the wafer 200 will be described with reference to FIGS. 4 and 5. FIG. 4 is a diagram showing a substrate processing process according to one embodiment of the present disclosure. FIG. 5 is a diagram showing a Mo-containing film forming process in the substrate processing process shown in FIG. 4. The process of forming the Mo-containing film is performed by using the process furnace 202 of the substrate processing apparatus 10 described above. In the following description, the operation of each of the parts constituting the substrate processing apparatus 10 is controlled by the controller 121.

The substrate processing process (semiconductor device manufacturing process) according to the present embodiment includes: (a) a step of accommodating the wafer 200 in the process chamber 201 of the process container; (b) a step of adjusting the temperature of the wafer 200 to a predetermined temperature; (c) a step of supplying a Mo-containing gas to the wafer 200; (d) a step of supplying a reducing gas to the wafer 200 for a first time; and (e) a step of forming a Mo-containing film on the wafer 200 by performing (c) and (d) once or more after (b).

When the term "wafer" is used herein, it may refer to "a wafer itself" or "a laminated body of a wafer and a predetermined layer or film formed on the surface of the wafer." When the term "wafer surface" is used herein, it may refer to "a surface of a wafer itself" or "a surface of a predetermined layer or a film formed on a wafer." In addition, when the term "substrate" is used herein, it may be synonymous with the term "wafer."

(Wafer Loading)

When a plurality of wafers 200 is charged to the boat 217 (wafer charging), as shown in FIG. 1, the boat 217 supporting the plurality of wafers 200 is lifted by the boat elevator 115, and is loaded into the process chamber 201 (boat loading) and accommodated in the process container. In this state, the seal cap 219 closes the lower end opening of the outer tube 203 via the O-ring 220.

(Pressure Regulation and Temperature Adjustment)

The inside of the process chamber 201, i.e., the space in which the wafers 200 exist, is vacuum-evacuated by the vacuum pump 246 so as to have a desired pressure (degree of vacuum). At this time, the pressure in the process chamber 201 is measured by the pressure sensor 245, and the APC valve 243 is feedback-controlled based on the measured pressure information (pressure regulation). The vacuum pump 246 keeps operating at least until the processing on the wafers 200 is completed.

Furthermore, the inside of the process chamber 201 is heated by the heater 207 so as to reach a desired temperature. At this time, the supply amount of power to the heater 207 is feedback-controlled based on the temperature information detected by the temperature sensor 263 so that the inside of the process chamber 201 has a desired temperature distribution (temperature adjustment). The heating of the inside of the process chamber 201 by the heater 207 is continuously performed at least until the processing on the wafers 200 is completed. Until the Mo-containing film-forming step described later is completed, the temperature of the heater 207 is adjusted so that the temperature of the wafers 200 becomes a temperature falling within a range of 400° C. or higher and 550° C. or lower, which is a predetermined temperature.

[Mo-Containing Film-Forming Step]

(Mo-Containing Gas Supply, Step S11)

The valve 314 is opened to allow a Mo-containing gas, which is a precursor gas, to flow into the gas supply pipe 310. The flow rate of the Mo-containing gas is adjusted by the MFC 312. The Mo-containing gas is supplied into the process chamber 201 from the gas supply holes 410a of the nozzle 410, and is exhausted from the exhaust pipe 231. At this time, the Mo-containing gas is supplied to the wafers 200. At the same time, the valve 514 is opened to allow an inert gas such as an Ar gas or the like to flow into the gas supply pipe 510. The flow rate of the Ar gas flowing through the gas supply pipe 510 is adjusted by the MFC 512. The Ar gas is supplied into the process chamber 201 together with the Mo-containing gas, and is exhausted from the exhaust pipe 231. At this time, for preventing the Mo-containing gas from entering the nozzle 420, the valve 524 is opened to allow the Ar gas to flow into the gas supply pipe 520. The Ar gas is supplied into the process chamber 201 via the gas supply pipe 320 and the nozzle 420, and is exhausted from the exhaust pipe 231. The Mo-containing gas is, for example, a gas containing Mo and oxygen (O). Specific examples of the Mo-containing gas include $MoO_2Cl_2$ and $MoOCl_4$.

At this time, the APC valve 243 is adjusted to regulate the pressure in the process chamber 201 to, for example, a pressure in the range of 1 to 3990 Pa, for example, 1000 Pa. The supply flow rate of the Mo-containing gas controlled by the MFC 312 is set to, for example, a flow rate within a range of 0.1 to 1.0 slm, preferably 0.1 to 0.3 slm. The supply flow rate of the Ar gas controlled by the MFC 512 and 522 is set to, for example, a flow rate within a range of 0.1 to 20 slm. The notation of a numerical range such as "1 to 3990 Pa" in the present disclosure means that the lower limit value and the upper limit value are included in the range. Therefore, for example, "1 to 3990 Pa" means "1 Pa or more and 3990 Pa or less". The same applies to other numerical ranges.

At this time, only the Mo-containing gas and the Ar gas flow in the process chamber 201. By supplying the Mo-containing gas, a Mo-containing layer is formed on the wafer 200 (the base film on the surface of the wafer 200). When the above-mentioned gas is used as the Mo-containing gas, the Mo-containing layer may be a Mo layer containing Cl or O, may be an adsorption layer of $MoO_2Cl_2$ (or $MoOCl_4$), or may be a layer including both layers.

(Removal of Residual Gas, Step S12)

After a lapse of a predetermined time, for example, 36 seconds from the start of the supply of the Mo-containing gas, the valve 314 of the gas supply pipe 310 is closed to stop the supply of the Mo-containing gas. That is, the time for supplying the Mo-containing gas to the wafer 200 is set to, for example, 36 seconds. At this time, the APC valve 243 of the exhaust pipe 231 is left open, the inside of the process chamber 201 is vacuum-evacuated by the vacuum pump 246, and the Mo-containing gas unreacted or contributed to the formation of the Mo-containing layer, which remains in the process chamber 201, is removed from the inside of the process chamber 201. That is, the inside of the process chamber 201 is purged. At this time, the valves 514 and 524 are kept open to maintain the supply of the Ar gas into the process chamber 201. The Ar gas acts as a purge gas, and can enhance the effect of removing the Mo-containing gas unreacted or contributed to the formation of the Mo-containing layer, which remains in the process chamber 201, from the inside of the process chamber 201.

(Reducing Gas Supply, Step S13)

After removing the residual gas in the process chamber 201, the valve 324 is opened to allow a reducing gas to flow into the gas supply pipe 320. The flow rate of the reducing gas is adjusted by the MFC 322. The reducing gas is supplied into the process chamber 201 through the gas supply holes 420a of the nozzle 420, and is exhausted from the exhaust pipe 231. At this time, the reducing gas is supplied to the wafer 200. At the same time, the valve 524 is opened to allow an Ar gas to flow into the gas supply pipe 520. The flow rate of the Ar gas flowing in the gas supply pipe 520 is adjusted by the MFC 522. The Ar gas is supplied into the process chamber 201 together with the reducing gas, and is exhausted from the exhaust pipe 231. At this time, for preventing the reducing gas from entering the nozzle 410, the valve 514 is opened to allow the Ar gas to flow into the gas supply pipe 510. The Ar gas is supplied into the process chamber 201 via the gas supply pipe 310 and the nozzle 410, and is exhausted from the exhaust pipe 231.

At this time, the APC valve 243 is adjusted so to regulate the pressure in the process chamber 201 to, for example, a pressure in a range of 1 to 3990 Pa, for example, 2000 Pa. The supply flow rate of the reducing gas controlled by the MFC 322 is set to, for example, a flow rate within a range of 1 to 50 slm, preferably 15 to 30 slm. The supply flow rate of the Ar gas controlled by the MFCs 512 and 522 is set to, for example, a flow rate within a range of 0.1 to 30 slm. At this time, the time for supplying the reducing gas to the wafer 200 is set to a time in a range of 10 minutes or more and 30 minutes or less, for example, 20 minutes. By setting the time for supplying the reducing gas to the wafer 200 to 10 minutes or more, it is possible to reduce the Mo-containing gas adsorbed to the wafer 200. By setting the time to 30 minutes or less, it is possible to improve the throughput and to secure the productivity.

At this time, only the reducing gas and the Ar gas flow in the process chamber 201. The reducing gas undergoes a substitution reaction with at least a part of the Mo-containing layer formed on the wafer 200 in step S11. That is, 0 and chlorine (Cl) in the Mo-containing layer react with the reducing gas, and are desorbed from the Mo-containing layer and discharged as reaction by-products such as water vapor ($H_2O$), hydrogen chloride (HCl), chlorine ($Cl_2$) and the like from the process chamber 201. Then, a Mo-containing layer containing Mo and substantially not containing Cl and O is formed on the wafer 200. As the reducing gas, it may be possible to use a hydrogen ($H_2$) gas, a phosphine ($PH_3$) gas, a monosilane ($SiH_4$) gas, a borane ($BH_3$) gas, a diborane ($B_2H_6$) gas, and the like.

(Removal of Residual Gas, Step S14)

After forming the Mo-containing layer, the valve 324 is closed to stop the supply of the reducing gas. Then, by the same processing procedure as in step S12 described above, the Mo-containing gas unreacted or contributed to the formation of the Mo-containing layer, which remains in the process chamber 201, is removed from the inside of the process chamber 201. That is, the inside of the process chamber 201 is purged.

(Performed a Predetermined Number of Times)

By performing a cycle of sequentially performing the above-described steps S11 to S14 at least once (a predetermined number of times (n times)), a Mo-containing film having a predetermined thickness is formed on the wafer 200. The above cycle is preferably repeated a plurality of times.

(After-Purging and Atmospheric Pressure Restoration)

An $N_2$ gas is supplied into the process chamber 201 from each of the gas supply pipes 510 and 520, and is exhausted from the exhaust pipe 231. The Ar gas acts as a purge gas, whereby the inside of the process chamber 201 is purged with the inert gas, and the gas and reaction by-products remaining in the process chamber 201 are removed from the inside of the process chamber 201 (after-purging). Thereafter, the atmosphere in the process chamber 201 is replaced with the inert gas (inert gas replacement), and the pressure in the process chamber 201 is restored to the atmospheric pressure (atmospheric pressure restoration).

(Wafer Unloading)

Thereafter, the seal cap 219 is lowered by the boat elevator 115 to open the lower end of the inner tube 203. Then, the processed wafers 200 are unloaded from the lower end of the inner tube 203 to the outside of the inner tube 203 while being supported by the boat 217 (boat unloading). Thereafter, the processed wafers 200 are taken out from the boat 217 (wafer discharging).

(3) Gas Supply System

Figure 6:
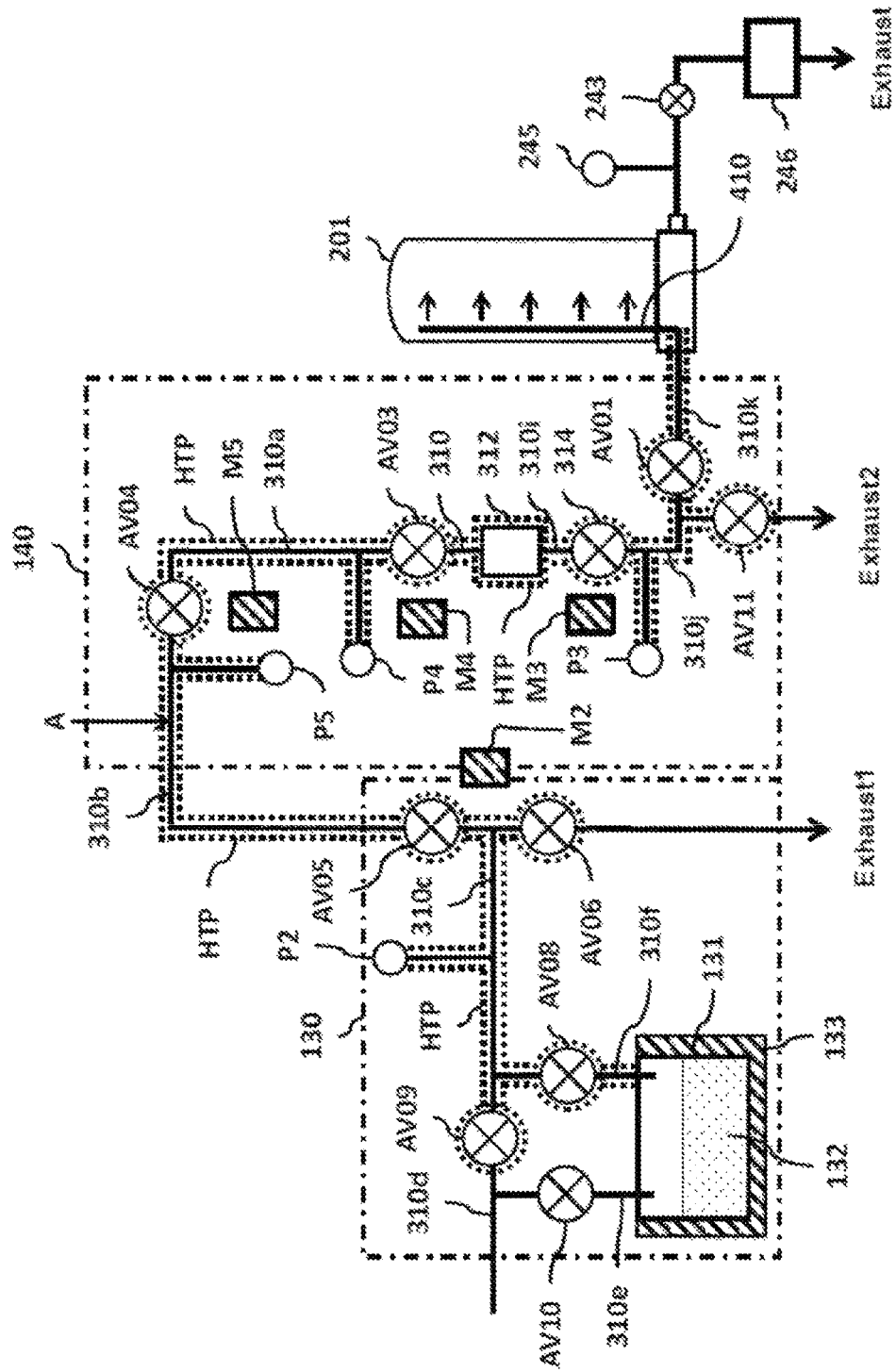
FIG. 6 is a diagram showing a precursor supplier and a flow rate controller preferably used in one embodiment of the present disclosure.

Next, a configuration example of a gas supply system that supplies the Mo-containing gas to the nozzle (gas supplier) 410 in the process chamber 201 will be described with reference to FIG. 6. FIG. 6 is a diagram showing a configuration example of the gas supply system preferably used in one embodiment of the present disclosure. As shown in FIG. 6, the gas supply system GSS includes a precursor supplier 130 and a flow rate controller 140. The precursor supplier 130 is a generator that generates a Mo-containing gas. The flow rate controller 140 controls the flow rate of the Mo-containing gas supplied from the precursor supplier 130, and supplies the Mo-containing gas to the nozzle (gas supplier) 410 in the process chamber 201.

The precursor supplier 130 includes a precursor container 131 filled with a solid precursor 132, a heater 133 configured to heat the precursor container 131, a plurality of valves AV05, AV06, AV08, AV09 and AV10, a plurality of gas supply pipes 310d, 310c, 310b, 310e and 310f, a pressure sensor P2 as a pressure detector (pressure detection part), and a heater HTP indicated by a dotted line.

The valve AV10 is provided between the gas supply pipe 310d and the gas supply pipe 310e. The valve AV09 is provided between the gas supply pipe 310d and the gas supply pipe 310c. The valve AV08 is provided between the gas supply pipe 310f and the gas supply pipe 310c. The valve AV05 is provided between the gas supply pipe 310c and the gas supply pipe 310b. The valve AV06 is provided in the gas supply pipe 310c, and the valve AV06 is connected to an exhauster (Exhaust1) that enables evacuation of the gas supply pipe 310c. The pressure sensor P2 is provided on the gas supply pipe 310c and can measure the pressure in the gas supply pipe 310c.

As indicated by the dotted line, the heater HTP can heat the plurality of valves AV05, AV06, AV08 and AV09, and the plurality of gas supply pipes 310c, 310b and 310f. The opened/closed state of the plurality of valves AV05, AV06, AV08, AV09 and AV10 is controlled by the controller 121. Further, the pressure measurement value of the pressure sensor P2 is supplied to the controller 121. The heating state of the heater HTP is controlled by the controller 121. In this regard, the lower limit of the heating temperature of the heater HTP may be set based on the vaporization temperature of the precursor, and the upper limit of the heating temperature may be set based on the temperature at which the characteristics of the solid precursor do not change or the heat resistant temperatures of the respective parts. When $MoO_2Cl_2$ is used as the solid precursor, the heating temperature of the heater HTP is set to, for example, a temperature in a temperature range of 50° C. to 250° C. Preferably, the heating temperature of the heater HTP is set to a temperature in a temperature range of 100° C. to 200° C. In this regard, the temperature at which the characteristics of the solid precursor do not change is, for example, a temperature at which the solid precursor does not decompose. In addition, the respective parts include the valves AV05, AV06, AV08 and AV09, the plurality of gas supply pipes 310c, 310b and 310f, and the like.

The solid precursor 132 is a metal-containing precursor or a transition metal-containing precursor. In this example, a Mo-containing precursor may be used as the solid precursor 132. The precursor container 131 is heated by the heater 133. An inert gas such as a nitrogen ($N_2$) gas, an argon (Ar) gas or a helium (He) gas is supplied to the gas supply pipe 310f. The inert gas is supplied to the precursor container 131 via the opened valve AV08 and the gas supply pipe 310e. By stirring the precursor container 131 with the inert gas, it is possible to generate a Mo-containing gas. The generated Mo-containing gas may be supplied to the gas supply pipe 310c via the gas supply pipe 310f and the opened valve AV08. The Mo-containing gas supplied to the gas supply pipe 310c is supplied to the gas supply pipe 310b via the opened valve AV05.

The flow rate controller 140 includes a plurality of valves AV04, AV03, 314, AV01 and AV11, an MFC 312, a plurality of gas supply pipes 310b, 310a, 310, 310i, 310j and 310k, a plurality of pressure sensors P5, P4 and P3, and a heater HTP.

The valve AV04 is provided between the gas supply pipe 310b and the gas supply pipe 310a, the pressure sensor P5 is provided on the gas supply pipe 310b, and the pressure sensor P4 is provided on the gas supply pipe 310a. The valve AV03 is provided between the gas supply pipe 310a and the gas supply pipe 310, and the MFC 312 is provided between the gas supply pipe 310 and the gas supply pipe 310i. The valve 314 is provided between the gas supply pipe 310i and the gas supply pipe 310j, and the pressure sensor P3 is provided on the gas supply pipe 310j. The valve AV01 is provided between the gas supply pipe 310j and the gas supply pipe 310k, the valve AV11 is provided on the gas supply pipe 310j, and the valve AV11 is connected to an exhauster (Exhaust2) that enables evacuation of the gas supply pipe 310j. The pressure sensors P5, P4 and P3 can measure the pressures in the gas supply pipes 310b, 310a and 310j, respectively.

As indicated by the dotted line, the heater HTP can heat the plurality of valves AV04, AV03, 314, AV01 and AV11, the MFC 312, and the plurality of gas supply pipes 310b, 310a, 310, 310i, 310j and 310k.

The opened/closed state of the plurality of valves AV04, AV03, 314, AV01 and AV11 is controlled by the controller 121. Further, the pressure measurement values of the pressure sensors P5, P4 and P3 are supplied to the controller 121. The heating state of the heater HTP is controlled by the controller 121.

For example, a case will be examined where molybdenum (Mo) solidifies and adheres to a portion A in the middle of the gas supply pipe 310b and the gas supply pipe 310b is blocked. The changes in the pressure values of the gas supply pipes 310b, 310a, and 310j measured by the pressure sensors P5, P4, and P3 can be checked by the controller 121. Therefore, the blocked state at the blocked portion A can be checked from the change in the pressure value of the gas supply pipe 301b measured by the pressure sensor P5. Thus, the gas supply pipe 301b between the valve AV04 and the valve AV05 including the blocked portion A is a replacement target, which makes it possible to reduce the replacement range of the gas supply pipe.

Figure 7:
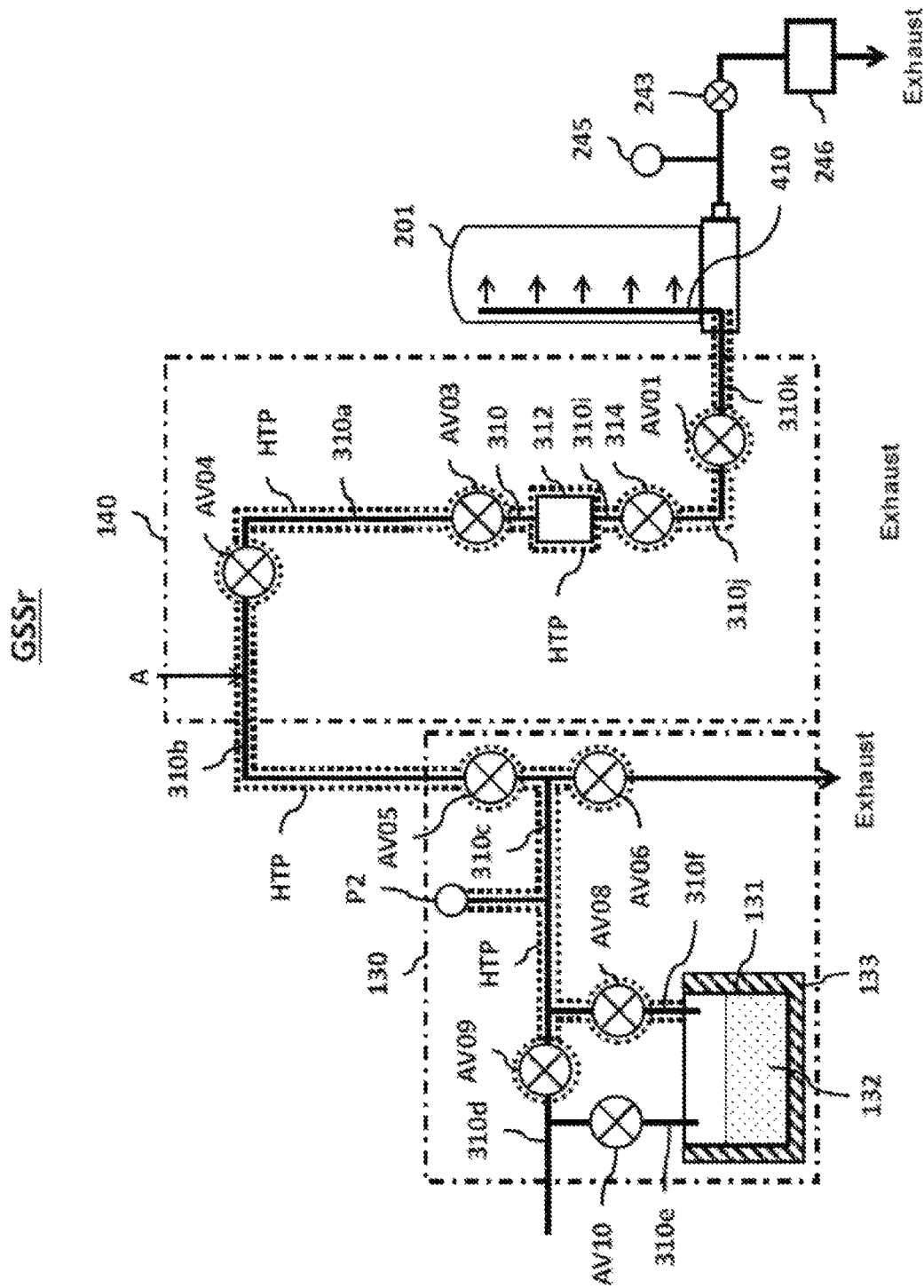
FIG. 7 is a diagram showing a configuration example of a gas supply system according to a comparative example.

FIG. 7 is a diagram showing a configuration example of a gas supply system according to a comparative example. The difference between FIG. 7 and FIG. 6 is that the pressure sensors P5, P4 and P3 and the valve AV11 are omitted in the gas supply system GSSr of FIG. 7. Since other configurations of FIG. 7 are the same as those of FIG. 6, the redundant description thereof will be omitted.

A case will be examined where molybdenum (Mo) solidifies and adheres to a portion A in the middle of the gas supply pipe 310b and the gas supply pipe 310b is blocked. When the portion A of the gas supply pipe 310b is blocked, even if the valves AV01, 314, AV03, AV04, AV05 and AV08 are opened and the flow rate is controlled by the MFC 312, the Mo-containing gas cannot flow from the blocked portion A to the process chamber 201. This leads to a state in which substrate processing cannot be performed.

In this case, the blockage of the inside of the gas supply pipe presumed and the blocked portion is specified by the function of detecting the failure of substrate processing or the flow rate abnormality of the MFC 312. The blocked portion A is specified based on the opening/closing information of the valves AV01, 314, AV03, AV04, AV05 and AV08 and the change in the numerical value of the pressure sensors P1 and P2. Since no pressure sensor is provided in the gas supply pipes 310b, 310a and 310j, it is not possible to check the change in the pressure value of the gas supply pipes 310b, 310a and 310j. For the gas supply pipes for which the changes in the pressure value cannot be checked, it is not possible to specify where the gas supply pipe is blocked. Therefore, it is necessary to replace the gas supply pipes (301b, 310a, 310, 310i, 310j and 310k) existing over a range from the valve AV05 to the front of the nozzle 410.

If the blocked portion cannot be specified, all the gas supply pipes in the blockage-presumed route have to be replaced, which requires a great deal of cost and labor. Accordingly, it takes a long time to specify the blocked portion and perform the replacement operation, and it takes a long time to eliminate the blockage of the gas supply pipe. Therefore, the downtime of the substrate processing apparatus becomes long, and as a result, the manufacturing throughput of the substrate processing apparatus decreases.

On the other hand, in FIG. 6, the changes in the pressure measurement values measured by the pressure sensors 245, P2, P3, P4 and P5 can be checked by the controller 121 of the substrate processing apparatus 10. Therefore, it is possible to provide a technique capable of shortening the time for eliminating the blockage of a gas supply pipe, and improving the manufacturing throughput of the substrate processing apparatus.

(4) Determination of Blockage Level of Gas Supply Pipe

Figures 8, 9:
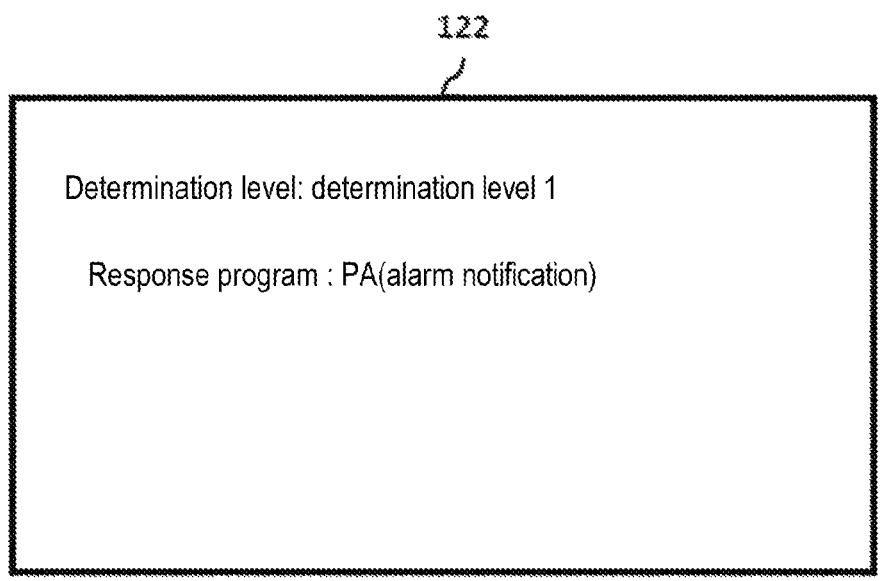
FIG. 8 is a table stored in a storage device and is a diagram showing a table of blockage levels and response programs.
FIG. 9 is a diagram illustrating a display state of an input/output device (display device) of the controller.

The method of eliminating the blockage of the gas supply pipe by replacing the gas supply pipe 310b including the blocked portion A when the gas supply pipe 310b is blocked has been described with reference to FIG. 6. However, the present disclosure is not limited thereto. It is also possible to select and take an appropriate measure that eliminates blockage by determining the blockage level of a gas supply pipe. That is, since the changes in the pressure measurement values measured by the pressure sensors 245, P2, P3, P4 and P5 can be checked by the controller 121 of the substrate processing apparatus 10, a blockage level determination program for determining a blockage level may be stored in the memory 121c of the controller 121, the blockage level determination program may be executed by the controller 121, and the blockage level may be determined based on the pressure measurement values measured by the pressure sensors 245, P2, P3, P4 and P5. In the determination of the blockage level by the blockage level determination program, as shown in FIG. 8, three blockage levels 1, 2 and 3 may be determined. Specifically, the blockage level is determined based on whether or not the measured pressure is out of a predetermined range. In this regard, the predetermined range is set for each blockage level. When a high pressure above the predetermined range is measured, it can be determined that blockage occurs on the downstream side of the pressure sensor that has measured the high pressure. Further, when a low pressure below the predetermined range is measured, it can be determined that blockage occurs on the upstream side of the pressure sensor that has measured the low pressure.

FIG. 8 is a diagram of a table stored in the storage device, showing blockage levels and response programs. In the memory 121c of the controller 121, the response programs for the respective blockage levels are also stored so that they can be read and executed by the controller 121. In the example of the table shown in FIG. 8, the response program PA for the blockage level 1 is a program that instructs alarm notification, the response program PB for the blockage level 2 is a program that instructs the heating of the gas supply pipe, and the response program PC for the blockage level 3 is a program that instructs the preparation for replacement of the gas supply pipe. When the blockage level determination result obtained by the blockage level determination program is the blockage level 1, the response program PA is selected and executed. When the blockage level determination result obtained by the blockage level determination program is the blockage level 2, the response program PB is selected and executed. When the blockage level determination result obtained by the blockage level determination program is the blockage level 3, the response program PC is selected and executed.

The blockage level and the program outline may be configured to have, for example, the following meanings.

1) Blockage level 1: Light blockage.

Program outline of program PA: An alarm message stating "Possibly blocked soon" is notified to at least one or both of the input/output device (display device) 122 of the controller 121 and the host device.

2) Blockage Level 2: Moderate Blockage

This means the blockage at which the gas supply pipe is not completely blocked and the pressure of the gas supply pipe can be restored without replacing the gas supply pipe if appropriate measures are taken.

Program outline of program PB: Raises the temperature of the heater HTP of the gas supply pipe after (on the downstream side of) the pressure sensor where the blockage level of which is determined.

3) Blockage Level 3: Heavy Blockage

This means that the gas supply pipe is completely blocked and the gas supply pipe needs to be replaced. Program outline of program PC: Since the gas supply pipe needs to be replaced, at least one or more of the following sub-response programs may be executable: C1) supply pipe replacement preparation program; C2) replacement support program; and C3) return operation program executed after replacement. The programs C1, C2 and C3 will be described later.

By determining the blockage level in the gas supply pipe in this way, it is possible to select and perform an appropriate blockage elimination measure, and it is possible to reduce the downtime of the substrate processing apparatus. That is, it is possible to improve the manufacturing throughput of the substrate processing apparatus 10.

The response program is a program that performs a notification, a pressure recovery process, and the like. In this regard, the pressure recovery process means a process for eliminating blockage. In the response program (e.g., the program PC for the blockage level 3), a plurality of processes (three sub-response programs C1, C2, C3) may be performed. The pressure in the gas supply pipe may be a predetermined value, i.e., a pinpoint pressure, or a pressure falling within a predetermined pressure range. Further, the downtime of the substrate processing apparatus 10 can be reduced by executing the corresponding response programs PA, PB and PC according to the blockage levels 1, 2 and 3.

In addition, by preparing a plurality of response programs and setting the response programs corresponding to the blockage levels in advance, it is possible to reduce the worker's examination load from the blockage level determination to the response program setting and to reduce the mistakes in selecting the response program, which depend on the level of a worker. The downtime of the substrate processing apparatus 10 can be reduced by these reductions.

FIG. 9 is a diagram illustrating a display state of the input/output device (display device) of the controller. When the controller 121 executes the blockage level determination program and determines the blockage level, for example, as shown in FIG. 9, the input/output device (display device) 122 of the controller 121 may the determined blockage level and the response program selected according to the determined blockage level. In FIG. 9, as an example, there is depicted a state in which the blockage level 1 as the determined blockage level and the response program PA (alarm notification) are displayed on the input/output device (display device) 122.

By displaying the response program on the input/output device (display device) 122 in this way, the worker can grasp the response program before and during execution thereof.

(Configuration Example of Heater HTP)

Figure 10:
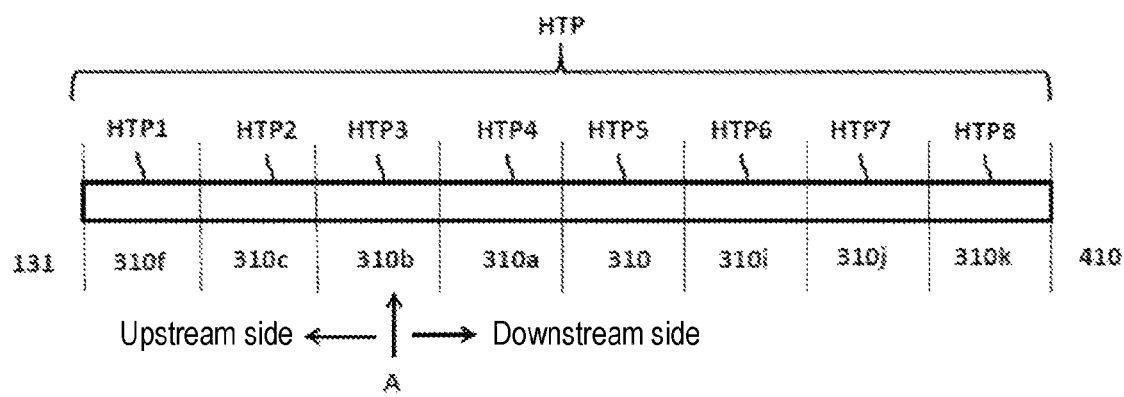
FIG. 10 is a diagram illustrating a configuration example of a heater HTP shown in FIG. 6.
Figure 11:
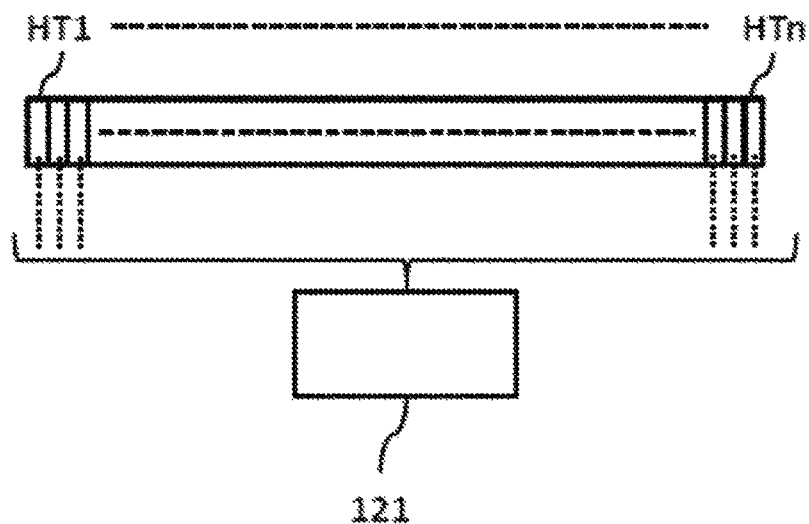
FIG. 11 is a diagram illustrating a configuration of one sub-heater shown in FIG. 10.

FIG. 10 is a diagram illustrating a configuration example of the heater HTP shown in FIG. 6. FIG. 11 is a diagram illustrating a configuration of one sub-heater shown in FIG. 10. The heater HTP is configured to include a plurality of sub-heaters HTP1 to HTP8 provided so as to correspond to the gas supply pipes 310*f*, 310*c*, 310*b*, 310*a*, 310, 310*i*, 310*j* and 310*k*, respectively. In FIG. 10, the valves AV05, AV06, AV08, AV09, AV04, AV03, 314, AV01 and AV11, which can be heated by the heater HTP, and the MFC 312, are omitted for simplification of the drawings. As shown in FIG. 11, each of the sub-heaters HTP1 to HTP8 is configured to include a plurality of heat generating elements HT1 to HTn. Each of the heat generating elements HT1 to HTn is configured so that the temperature thereof can be controlled by the controller 121. The controller 121 controls the amount of current supplied to each of the heat generating elements HT1 to HTn to control the amount of heat generated by the heat generating elements HT1 to HTn. In FIG. 11, the temperature of each of the heat generating elements HT1 to HTn can be controlled as follows.

Temperature control 1: The amounts of current supplied to the respective heat generating elements HT1 to HTn are kept constant. As a result, the temperatures of the corresponding sub-heaters can be set to a constant desired temperature over the entire region of the sub-heaters.

Temperature control 2: The amounts of current supplied to the respective heat generating elements HT1 to HTn are individually controlled so as to gradually increase from the heat generating element HT1 toward the heat generating element HTn. As a result, the temperatures of the corresponding sub-heaters can be controlled to gradually change from the desired first temperature to a desired second temperature different from the first temperature.

Temperature control 3: Among the amounts of current supplied to the heat generating elements HT1 to HTn, the amounts of one or more desired heat generating elements are individually controlled so as to be smaller than the amounts of current supplied to the remaining heat generating elements. As a result, for example, in the corresponding sub-heaters, it is possible to execute control so that a part of the region has a low temperature and the remaining region has a high temperature.

In FIG. 10, for example, it is assumed that a blocked portion A occurs in the gas supply pipe 310*c*. In the subject specification, the side of the nozzle 410 as viewed from the blocked portion A is defined as "downstream side", and the side of the precursor container 131 as viewed from the blocked portion A is defined as "upstream side".

(Temperature Control of Gas Pipe Heater)

The temperature control of the gas pipe heater HTP when the program PB is selected as a response program will be described below.

When the blocked portion A occurs in the gas supply pipe 310*c*, the controller 121 is configured to be capable of controlling the temperatures of the sub-heaters HTP1 to HTP8 of the gas pipe heater HTP according to the blockage level. More specifically, the controller 121 is configured to be capable of controlling the temperatures of the gas pipe heater HTP to raise the temperatures of the gas pipe heater HTP3 of the gas supply pipe (310*b*) including the blockage-determined pressure sensor (P5) among the plurality of pressure sensors P2, P5, P4 and P3 and the temperatures of all the gas pipe heaters (HTP4 to HTP8) located on the downstream side of the gas supply pipe (310*b*).

By such temperature control, the temperature of the gas supply pipe (310*b*) in the blocked zone and the temperatures of the gas supply pipes (310*a*, 310, 310*i*, 310*j* and 310*k*) in the zone on the downstream side of the blocked zone can be raised to suppress the occurrence of new solidification.

Figure 12:
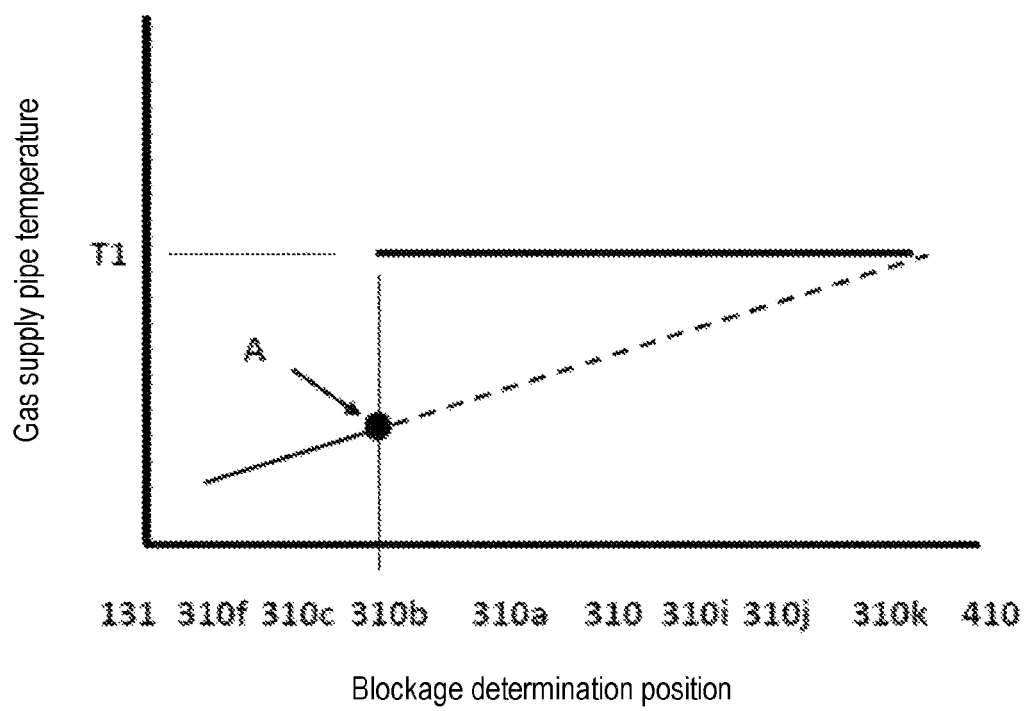
FIG. 12 is a diagram illustrating an example of temperature control of a gas pipe heater.

FIG. 12 is a diagram illustrating an example of the temperature control of the gas pipe heater. FIG. 12 shows the relationship between the temperature of the gas supply pipe and the blockage determination position. The vertical axis indicates the temperature of the gas supply pipe, and the horizontal axis indicates the gas supply pipes (310*f*, 310*c*, 310*b*, 310*a*, 310, 310*i*, 310*j* and 310*k*) between the precursor container 131 and the nozzle 410. In this example, the blockage determination position is the blocked portion A, which is the zone of the gas supply pipe (310*b*).

In the example of FIG. 12, the temperature of the gas pipe heater HTP is controlled by the controller 121 so as to raise the temperatures of the gas supply pipes (310*b*, 310*a*, 310, 310*i*, 310*j* and 310*k*) to a substantially constant temperature T1 from the blocked portion A toward the nozzle 410 in the entire zone after the blocked portion A. The constant temperature T1 is, for example, the maximum temperature of the process chamber 201 in which the nozzle 410 is provided.

Figure 13:
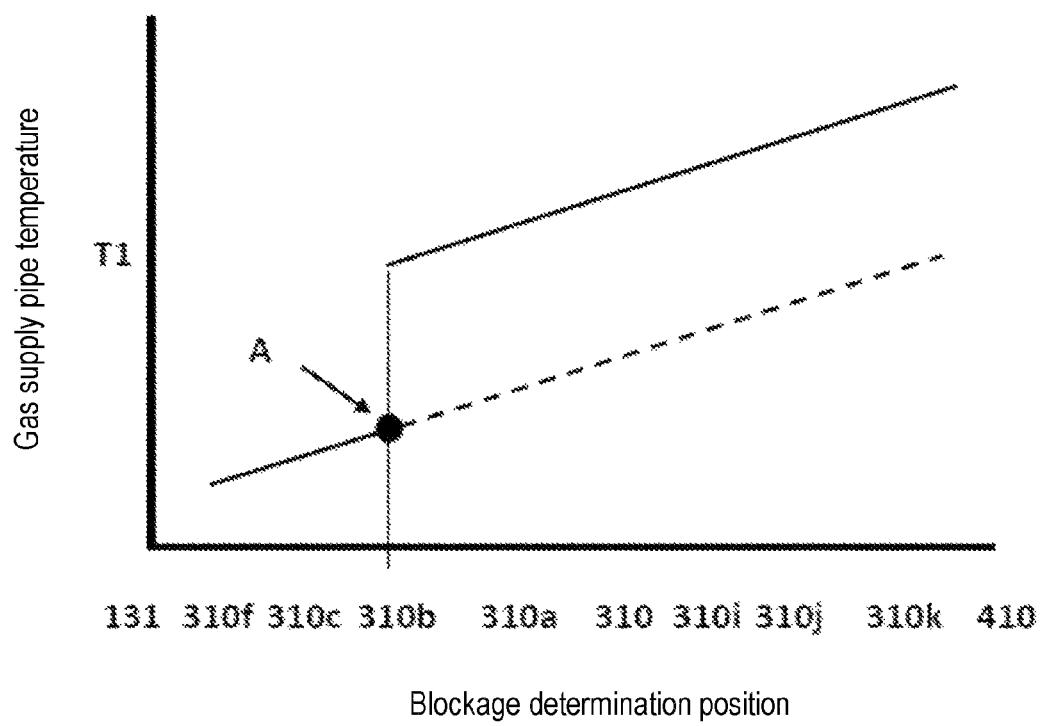
FIG. 13 is a diagram illustrating another example of the temperature control of the gas pipe heater.
Figure 14:
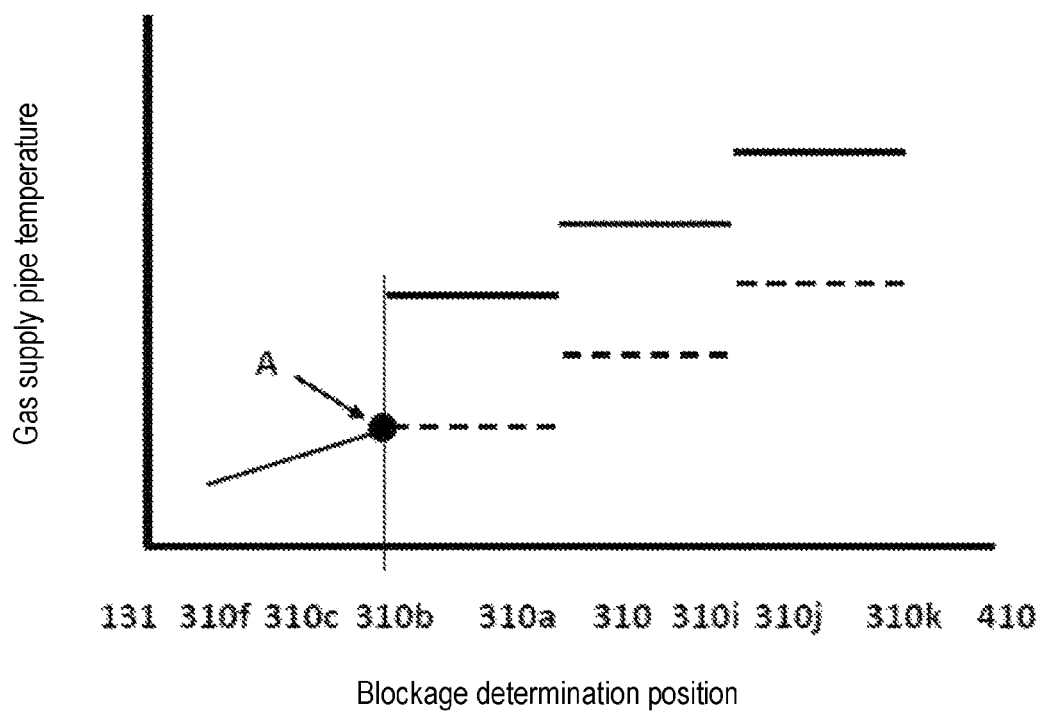
FIG. 14 is a diagram illustrating a further example of the temperature control of the gas pipe heater.

In FIG. 12, the temperature control indicated by a dotted line (which increases the temperature toward the process chamber 201 where the nozzle 410 is provided) is performed for the following reasons. During the temperature control of the gas tube heater HTP, the temperature may fluctuate. It is necessary to prevent the temperature of the gas tube heater HTP from becoming equal to or lower than the vaporization temperature of the solidified and adhered molybdenum (Mo) due to the occurrence of overshooting. For example, during the processing of the substrate 200, a precursor gas such as a Mo-containing gas or the like flows at a large amount, so that the temperature of the gas supply pipe drops. At this time, the temperature control of the gas pipe heater HTP may not be in time. The temperature of the gas supply pipe may temporarily drop to approach the vaporization temperature, and then may become a temperature lower than the vaporization temperature. Therefore, it is preferable to set the temperature of the gas supply pipe to a temperature higher than the vaporization temperature. Further, in the case of the solid precursor 132, the gas (e.g., Mo-containing gas) once vaporized has a property of returning to a solid when the temperature of the gas becomes lower than the heated temperature. In front (upstream side) of each valve and the flow rate controllers (the mass flow controller 312, the orifice, etc.), the pressure in the gas supply pipe is high. In particular, the pressure in the gas supply pipe is high on the upstream side of the flow rate controllers (mass flow controller 312). In this way, when the pressure increases, an environment is created in which solidification is easily generated due to the vapor pressure of the precursor. Therefore, it is better to control the temperature so that as indicated by the dotted line, the temperature is stepwise (gradually) increased in response to the pressure rise in the gas supply pipe. The temperature zone indicated by the dotted line in FIGS. 12 to 14 is a temperature zone of 120° C. to 170° C., for example, when a Mo-containing precursor is used as the solid precursor. The temperature around the precursor container 131 is set to 120° C., and the temperature around the MFC 312 is set to 150° C. The temperature around the gas supply pipe 310*k* is set to 170° C. By setting the temperature in this way, it is possible to suppress the occurrence of solidification of the precursor.

As shown in FIG. 12, the temperature of the gas pipe heater HTP is controlled to raise the temperature of the blocked zone (here, the zone of the gas supply pipe 310*b*) and the temperature of the gas supply pipe of the zones (here, the respective zones of the gas supply pipes 310*a*, 310, 310*i*, 310*j* and 310*k*) on the downstream side of the blocked zone to a substantially constant temperature T1, whereby the occurrence of new solidification can be suppressed. By raising the temperature to the constant temperature T1 (e.g., the temperature on the side closest to the process chamber 201), it is possible to suppress a change in the temperature history of the gas supply pipe. For example, the side closest to the process chamber 201 has a small temperature change, and the change in the temperature history on the side closest to the process chamber 201 can be suppressed. As a result, it is possible to suppress a change in the atmosphere in the gas supply pipe (310*k*) on the side closest to the process chamber 201. Since the state of the process gas (Mo-containing precursor gas) supplied to the substrate 200 does not change, the characteristics of the Mo film formed on the substrate 200 do not change before and after the execution of the response program PB.

On the other hand, due to the change in the atmosphere in the gas supply pipe on the side closest to the process chamber 201, the state of the process gas (Mo-containing gas) supplied to the substrate 200 may change before and after the response program PB is executed, and the characteristics of the Mo film formed on the substrate 200 may change before and after the execution of the response program PB. In this regard, the film characteristics mean a film thickness, a resistivity, a composition ratio, crystallinity, roughness, and the like.

FIG. 13 is a diagram illustrating another example of the temperature control of the gas pipe heater. Just like FIG. 12, FIG. 13 shows the relationship between the temperature of the gas supply pipe and the blockage determination position. The vertical axis indicates the temperature of the gas supply pipe, and the horizontal axis indicates the gas supply pipes (310*f*, 310*c*, 310*b*, 310*a*, 310, 310*i*, 310*j* and 310*k*) between the precursor container 131 and the nozzle 410. In this example, the blockage determination position is the blocked portion A, which is the zone of the gas supply pipe (310*b*).

In FIG. 13, there is shown an example of temperature control in which the temperature of the gas pipe heater HTP is controlled by the controller 121 so as to gradually raise the temperature of the gas supply pipes (310*b*, 310*a*, 310, 310*i*, 310*j* and 310*k*) from the blocked portion A toward the nozzle 410.

By adopting the configuration in which the heating temperature of the gas supply pipe is raised toward the downstream side of the gas supply pipe (310*b*), for example, the occurrence of re-solidification of the molybdenum (Mo) precursor can be suppressed in the gas supply pipes (310*b*, 310*a*, 310, 310*i*, 310*j* and 310*k*). By this temperature control, even if the temperature of the gas supply pipe is temporarily lowered, it is possible to prevent the temperature from falling in, for example, a temperature at which the molybdenum (Mo) precursor is re-solidified.

FIG. 14 is a diagram illustrating a further example of the temperature control of the gas pipe heater. Just like FIG. 12, FIG. 13 shows the relationship between the temperature of the gas supply pipe and the blockage determination position. The vertical axis indicates the temperature of the gas supply pipe, and the horizontal axis indicates the gas supply pipes (310*f*, 310*c*, 310*b*, 310*a*, 310, 310*i*, 310*j* and 310*k*) between the precursor container 131 and the nozzle 410. In this example, the blockage determination position is the blocked portion A, which is the zone of the gas supply pipe (310*b*).

In FIG. 14, there is shown an example of temperature control in which the temperature of the gas pipe heater HTP is controlled by the controller 121 so as to stepwise raise the temperature of the gas supply pipes (310*b*, 310*a*, 310, 310*i*, 310*j* and 310*k*) from the blocked portion A toward the nozzle 410. As a result, the same effects as those of the temperature control shown in FIG. 13 may be obtained.

When raising the temperature of the gas pipe heater HTP in the case of selecting the program PB, the controller 121 preferably controls the opening and closing of the plurality of valves (AV04, AV03, 314 and AV01) located on the downstream side of the blockage-determined pressure detector (pressure sensor P5) so as to fully open the plurality of valves (AV04, AV03, 314 and AV01). As a result, it is possible to prevent the solidified precursor in the region of the blockage determination position A from being re-solidified in the internal portion of each valve (AV04, AV03, 314 and AV01). If each valve (AV04, AV03, 314 and AV01) is not fully opened, the pressure in the gas supply pipe in front of each valve (AV04, AV03, 314 and AV01) may increase. When the pressure rises, the vaporized precursor may be re-solidified due to the vapor pressure relationship. By fully opening the plurality of valves (AV04, AV03, 314 and AV01) and creating an environment in which the pressure in the gas supply pipe does not rise, it is possible to suppress the re-solidification of the vaporized precursor.

As shown in FIG. 6, the gas supply system GSS includes an exhauster (Exhaust 2) that evacuates the inside of the gas supply pipes (310*f*, 310*c*, 310*b*, 310*a*, 310, 310*i*, 310*j* and 310*k*) via the valve AV11. The controller 121 is configured to be capable of controlling the exhauster (Exhaust 2) to evacuate the inside of the gas supply pipes (310*f*, 310*c*, 310*b*, 310*a*, 310, 310*i*, 310*j* and 310*k*) by opening the valve AV11 while heating the gas supply pipe as described with reference to FIGS. 12 to 14.

Thus, by evacuating the inside of the exhaust gas supply pipe and lowering the pressure in the gas supply pipe, it is possible to convert the solidified precursor into an easily vaporizable state and to shorten the time required for eliminating the blockage caused by the precursor solidified in the gas supply pipe. That is, in view of the vapor pressure relationship, the solidified precursor comes into an easily vaporizable state when the pressure in the gas supply pipe is low.

As shown in FIG. 6, the gas supply system GSS includes an inert gas supplier (310d and AV09) that supplies an inert gas into the gas supply pipes (310f, 310c, 310b, 310a, 310, 310i, 310j and 310k). The inert gas is a nitrogen ($N_2$) gas, an argon (Ar) gas, a helium (He) gas or the like, and the inert gas supplier (310d and AV09) is composed of the gas supply pipe 310d and the VA valve AV09. By opening the VA valve AV09, the inert gas is supplied from the gas supply pipe 310d into the gas supply pipes (310f, 310c, 310b, 310a, 310, 310i, 310j and 310k).

The controller 121 is configured to be capable of controlling the inert gas supplier (310d and AV09) and the exhausters (Exhaust1 and Exhaust2) to repeat the supply of the inert gas into the gas supply pipes (310f, 310c, 310b, 310a, 310, 310i, 310j and 310k) and the evacuation of the inside of the gas supply pipes (310f, 310c, 310b, 310a, 310, 310i, 310j and 310k) while heating the gas supply pipes as described with reference to FIGS. 12 to 14.

As a result, the inert gas supply state and the vacuum evacuation state are alternately performed in the gas supply pipes (310f, 310c, 310b, 310a, 310, 310i, 310j and 310k), whereby the inert gas flows vigorously toward an atmosphere having a low pressure. As a result, the solidified precursor can be blown to the exhausters (Exhaust 1 and Exhaust 2) by the momentum of the inert gas.

(Preparation Program C1 for Supply Pipe Replacement)

Next, as a response program, the preparation program C1 for replacing the supply pipe when the replacement of the gas supply pipe is selected will be described.

Figure 15:
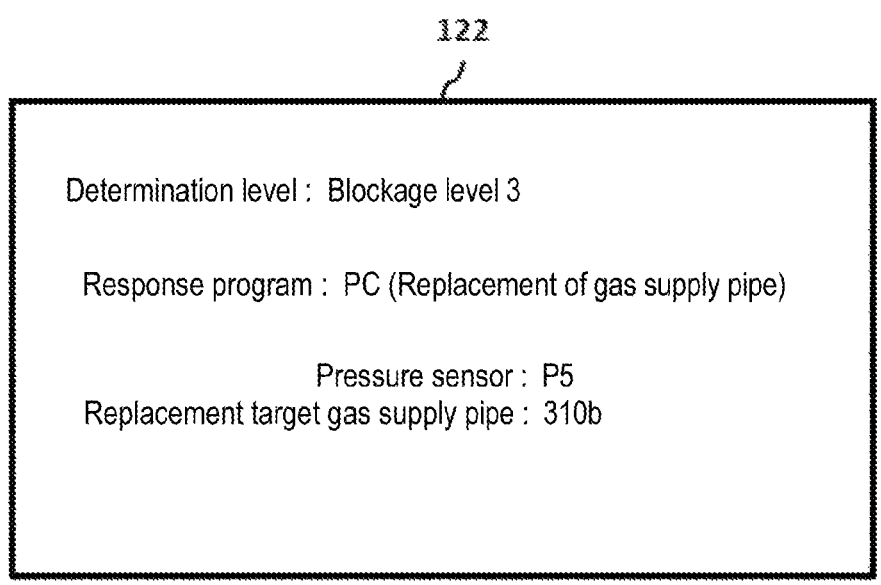
FIG. 15 is a diagram illustrating a display state of the input/output device (display device) of the controller.

FIG. 15 is a diagram illustrating a display state of the input/output device (display device) of the controller. When the controller 121 executes a blockage level determination program and determines a blockage level 3, the controller 121 may allow the input/output device (display device) 122 to display the determined blockage level 3, the response program PC selected according to the determined blockage level, the pressure sensor P5 that has determined the blockage in the gas supply pipes (310f, 310c, 310b, 310a, 310, 310i, 310j and 310k), and the gas supply pipe 310b as a replacement target gas supply pipe provided with the pressure sensor P5 that has determined the blockage. The controller 121 may notify at least one or both of the input/output device (display device) 122 and the host device (HOST device) of the information that the gas supply pipe is to be replaced. Further, the notification may be made by allowing the display device to display a schematic piping diagram such as the gas supply system GSS shown in FIG. 6 and changing the color of the gas supply pipe 310, the valve, the pressure sensor, and the like to be replaced.

As shown in FIG. 6, the gas supply system GSS includes the exhausters (Exhaust 1 and Exhaust 2) that evacuates the inside of the gas supply pipe. The controller 121 is configured to be capable of controlling the exhausters (Exhaust 1 and Exhaust 2) to evacuate the gas supply pipe 310c on the upstream side of the gas supply pipe 310b and the gas supply pipes (310a, 310, 310i and 310j) on the downstream side of the gas supply pipe 310b to which the pressure sensor P5 that has determined the blockage belongs, among the plurality of gas supply pipes (310f, 310c, 310b, 310a, 310, 310i, 310j and 310k).

By exhausting the process gas (Mo-containing gas) existing in the gas supply pipes on the upstream side and the downstream side of the gas supply pipe to be replaced in this way, it is possible to suppress leakage of the process gas when the gas supply pipe is replaced.

Further, as shown in FIG. 6, the gas supply system GSS includes the inert gas supplier (310d and AV09) that supplies the inert gas into the gas supply pipes (310f, 310c, 310b, 310a, 310, 310i, 310j and 310k). The controller 121 is configured to be capable of controlling the inert gas supplier (310d and AV09) to supply the inert gas to the gas supply pipe 310c on the upstream side and the gas supply pipes (310a, 310, 310i and 310j) on the downstream side of the gas supply pipe 310b to which the pressure sensor P5 that has determined the blockage belongs. By supplying the inert gas to the gas supply pipe 310c on the upstream side and the gas supply pipes (310a, 310, 310i and 310j) on the downstream side in this way, it is possible to push out the gas remaining in the gas supply pipes (310f, 310c, 310b, 310a, 310), 310i, 310j and 310k) and to replace the gas.

Further, the controller 121 is configured to be capable of controlling the exhausters (Exhaust 1 and Exhaust 2) and the inert gas supplier to alternately perform the evacuation of the gas supply pipe 310c on the upstream side and the gas supply pipes (310a, 310, 310i and 310j) on the downstream side of the gas supply pipe 310b to which the pressure sensor P5 that has determined the blockage belongs, and the inert gas supply through the inert gas supplier (310d and AV09). By alternately executing the inert gas supply and the evacuation in this way, it is possible to reduce the residual gas in the gas supply pipes (310f, 310c, 310b, 310a, 310, 310i, 310j and 310k).

Further, the controller 121 is configured to be capable of controlling the plurality of sub-heaters (HTP1 to HTP8) to lower the temperature of the sub-heater HTP3 provided in the gas supply pipe 310b to which the pressure sensor P5 that has determined the blockage belongs, while maintaining the temperature of the sub-heaters (HTP2 and HTP4 to HTP7) provided on the upstream side and the downstream side of the gas supply pipe 310b to which the pressure sensor P5 that has determined the blockage belongs. In this way, by lowering the temperature of the gas supply pipe 310b to be replaced while maintaining the temperatures of the gas supply pipe 310c on the upstream side and the gas supply pipes (310a, 310, 310i and 310j) on the downstream side, which are not the replacement targets, it is possible to improve the workability at the time of replacement.

Further, the controller 121 is configured to be capable of controlling the plurality of sub-heaters (HTP1 to HTP8) to lower the temperature of the sub-heater HTP3 provided in the gas supply pipe 310b to which the pressure sensor P5 that has determined the blockage belongs, after the process of evacuating the inside of the gas supply pipes and supplying the inert gas into the gas supply pipes is completed. In this way, by evacuating the gas supply pipes and supplying the inert gas while heating the gas supply pipe 310b to be replaced, it is possible to remove the precursor (solid) remaining in the gas supply pipes. Further, by lowering the temperature of the gas supply pipe 310b to be replaced while converting the inside of the gas supply pipes into an inert gas atmosphere, it is possible to reduce the natural cooling time for the gas supply pipe 310b.

Further, the controller 121 is configured to be capable of controlling the plurality of sub-heaters (HTP1 to HTP8) so that the temperature of the portion on the side of the gas supply pipe 310b to which the pressure sensor P5 that has determined the blockage belongs, in the gas pipe heaters (HTP2 and HTP4) provided on the gas supply pipe 310c on the upstream side and the gas supply pipe 310a on the downstream side of the gas supply pipe 310b to which the pressure sensor P5 that has determined blockage belongs, becomes lower than the temperature of other portions of the gas pipe heaters (HTP2 and HTP4).

Figure 16:
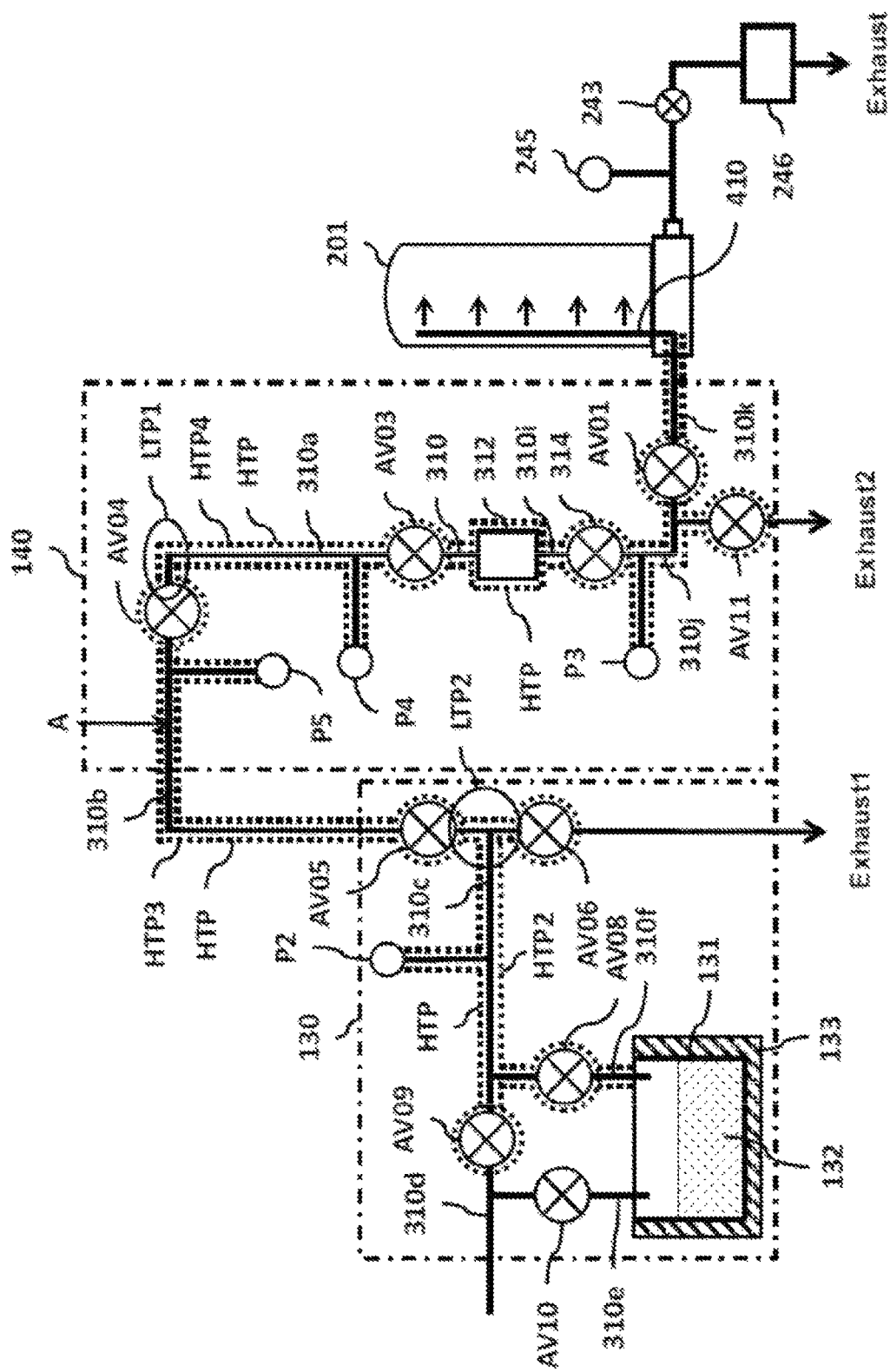
FIG. 16 is a diagram illustrating the low temperature portions of the gas pipe heaters (HTP2 and HTP4).

FIG. 16 is a diagram illustrating the low temperature portions of the gas pipe heaters (HTP2 and HTP4). In FIG. 16, the gas supply pipe 310c can be heated by the gas pipe heater HTP2, and the gas supply pipe 310a can be heated by the gas pipe heater HTP4. In this regard, the temperature of the portion LTP2 of the gas pipe heater HTP2 on the side of the gas supply pipe 310b is controlled to be lower than the temperature of other portions of the gas pipe heater HTP2. Similarly, the temperature of the portion LTP1 of the gas pipe heater HTP4 on the side of the gas supply pipe 310b is controlled to be lower than the temperature of other portions of the gas pipe heater HTP4.

By lowering the temperature of the portions (LTP2 and LTP1) of the gas pipe heaters (HTP2 and HTP4) close to the gas supply pipe 310b in the replacement target range, it is possible to improve the ease of replacement work of the gas supply pipe 310b. That is, if the temperature of the portions (LTP2 and LTP1) close to the gas supply pipe 310b in the replacement target range remains high, the replacement work itself is difficult. Further, when the precursor (solid) remains in the portions (LTP2 and LTP1) close to the gas supply pipe 310b in the replacement target range, it is possible to reduce the reactivity between the precursor (solid) and the atmospheric air.

(Replacement Support Program C2)

Next, as a response program, the replacement support program C2 for the actual replacement work when pipe replacement is selected will be described.

The controller 121 may notify (display) the position of the gas supply pipe 310b of the replacement portion to the input/output device (display device) 122. As a result, it is possible to reduce work mistakes during the replacement work of the gas supply pipe 310b. In addition, it is possible to clarify to other personnel other than the worker that the replacement work is being performed. This is because, in general, the piping of the gas supply pipes of the substrate processing apparatus 10 is often located on the back side of the substrate processing apparatus 10, and the work being performed is hardly understood from the front side of the substrate processing apparatus 10.

The gas supply system GSS includes at least one gas detector M for detecting a chlorine-containing gas. The controller 121 is configured to be capable of controlling the input/output device (display device) 122 to notify an alarm according to the value measured by the gas detector when the gas supply pipe 310b is replaced. FIG. 6 shows an example in which four gas detectors M2, M3, M4 and M5 are provided. Preferably, the gas detectors are provided near the connection points of the pipes or the connection points of the valves.

As a result, if the above-mentioned Mo-containing gas remains in the pipe, the Mo-containing gas may react with $H_2O$ (water) in the air to generate hydrogen chloride (HCl) as a chlorine-containing gas. When HCl is detected by the gas detector, the operator may be notified of the generation state of HCl by notifying the input/output device (display device) 122 of an alarm.

(Return Operation Program C3 Executed after Replacement)

Next, as a response program, the return operation program C3 which is executed after the pipe replacement work will be described.

The controller 121 is configured to be capable of controlling the gas supply system GSS to execute a state restoration process of the gas supply system GSS after detecting that the gas supply pipe 310b to be replaced has been replaced. By performing the state restoration process of the gas supply system GSS, it is possible to reduce the difference in gas flow characteristics before the replacement of the gas supply pipe and after the replacement of the gas supply pipe.

The state restoration process of the gas supply system GSS is performed by sequentially executing S1 to S5 below. The following S6 may be included in the state restoration process.

S1: Leak check of the entire gas supply pipe after replacement

S2: Gas replacement for the entire gas supply pipe (atmospheric air exhaust $N_2$ replacement)

S3: Temperature recovery operation of the entire gas supply pipe

S4: Supply of Mo-containing gas

S5: Flow rate check (check the difference between the flow rate before blockage and the flow rate before replacement)

Check the flow rate in MFC 312

Check the pressure measurement values of the pressure sensors P2 to P5 and 245

Comparison of the pressure before and after the blockage and the flow rate before and after the blockage S6: The results of the above S1 to S5 are recorded in the memory 121c as the replacement history of the gas supply pipe.

Aspects of Present Disclosure

Hereinafter, other aspects of the present disclosure will be additionally described as supplementary notes.

(Supplementary Note 1)

According to one aspect of the present disclosure, the controller of the substrate processing apparatus is configured to be capable of fully opening the valve located on the downstream side of the pressure detector that has determined the blockage, when raising the temperature of the gas pipe heater.

(Supplementary Note 2)

In the substrate processing apparatus of Supplementary Note 1, the gas supply system includes at least one gas detector configured to detect a chlorine-containing gas, and the controller is configured to be capable of controlling the display device to notify an alarm according to the value measured by the gas detector when the pipe is replaced.

(Supplementary Note 3)

In the substrate processing apparatus of Supplementary Note 1, the controller is configured to be capable of controlling the gas supply system to execute a state restoration process of the gas supply system after detecting that the pipe to be replaced has been replaced.

The present disclosure made by the present disclosers has been specifically described above based on embodiments. However, it goes without saying that the present disclosure is not limited to the above-described embodiments and examples and may be variously modified.

For example, in the present disclosure, a vertical apparatus capable of processing a plurality of substrates has been described as an example of the substrate processing apparatus. However, the technique of the present disclosure may be applied to a single-substrate type processing apparatus that processes substrates one by one. In the case of the single-substrate type processing apparatus, the gas supplier may be composed of a shower head.

Further, in the present disclosure, the precursor containing Mo has been described as an example of the solid precursor.

However, the precursor is not limited to Mo, and may be a solid precursor containing at least one of aluminum (Al), titanium (Ti), zirconium (Zr), hafnium (Hf) and ruthenium (Ru), and a halogen element.

According to the present disclosure in some embodiments, it is possible to shorten the time required for eliminating blockage of a gas supply pipe and to improve the manufacturing throughput of a substrate processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    a reaction container configured to accommodate a substrate;
    an exhaust pipe configured to exhaust an atmosphere inside the reaction container;
    a gas supplier configured to supply a process gas to the substrate; and
    a gas supply system comprising:
    a plurality of valves;
    a plurality of gas supply pipes kept in fluid communication with the gas supplier and configured to supply the process gas into the reaction container, each of the plurality of gas supply pipes being installed between a pair of valves among the plurality of valves; and
    a plurality of pressure detectors provided on the plurality of gas supply pipes, respectively, each of the plurality of pressure detectors being disposed between the pair of valves among the plurality of valves;
    a controller configured to be capable of:
    determining whether a measurement result measured by one of the plurality of pressure detectors is higher than a predetermined value; and
    performing at least one selected from the group of:
    in response to determining that the measurement result is higher than the predetermined value, determining that blockage occurs on one or more gas supply pipes among the plurality of gas supply pipes, which are installed at a downstream side of the one of the plurality of pressure detectors; and
    in response to determining that the measurement result is lower than the predetermined value, determining that blockage occurs on one or more gas supply pipes among the plurality of gas supply pipes, which are installed at an upstream side of the one of the plurality of pressure detectors; and
    a display device connected to the controller,
    wherein the controller is further configured to be capable of displaying information about a response program on the display device based on one or more measurement results measured by the plurality of pressure detectors.

2. The substrate processing apparatus of claim 1, wherein the controller is configured to be capable of:
    determining blockage levels of the plurality of gas supply pipes based on the one or more measurement results of the plurality of pressure detectors; and
    controlling the gas supply system to execute the response program according to the blockage levels.

3. The substrate processing apparatus of claim 2, further comprising a memory configured to store a plurality of response programs,
    wherein the controller is configured to be capable of selecting a response program corresponding to the blockage level from the plurality of response programs and executing the selected response program.

4. The substrate processing apparatus of claim 2, wherein the gas supply system comprises a plurality of gas pipe heaters corresponding to the plurality of pressure detectors, respectively, and configured to heat the plurality of gas supply pipes, and
    wherein the controller is configured to be capable of controlling temperature of the one or more gas pipe heaters according to the blockage levels.

5. The substrate processing apparatus of claim 4, wherein the gas supply system comprises an exhauster configured to evacuate an inside of the plurality of gas supply pipes, and
    wherein the controller is configured to be capable of controlling the exhauster to evacuate the inside of the plurality of gas supply pipes while heating the plurality of gas supply pipes.

6. The substrate processing apparatus of claim 4, wherein the gas supply system comprises an inert gas supplier configured to supply an inert gas into the plurality of gas supply pipes and an exhauster configured to evacuate an inside of the plurality of gas supply pipes, and
    wherein the controller is configured to be capable of controlling the inert gas supplier and the exhauster to repeat supplying the inert gas into the plurality of gas supply pipes and evacuating the inside of the plurality of gas supply pipes while heating the plurality of gas supply pipes.

7. The substrate processing apparatus of claim 6, wherein the controller is configured to be capable of controlling the plurality of gas pipe heaters to lower temperature of a gas pipe heater provided on a gas supply pipe to which a pressure detector for which blockage has been determined belongs, after evacuating the plurality of gas supply pipes and supplying the inert gas into the plurality of gas supply pipes are completed.

8. The substrate processing apparatus of claim 4,
    wherein the gas supply system comprises an exhauster configured to evacuate an inside of the plurality of gas supply pipes, and
    wherein the controller is configured to be capable of controlling the exhauster to evacuate a gas supply pipe on an upstream side and a gas supply pipe on a downstream side of a gas supply pipe to which a pressure detector for which blockage has been determined belongs, among the plurality of gas supply pipes.

9. The substrate processing apparatus of claim 4,
    wherein the gas supply system comprises an inert gas supplier configured to supply an inert gas into the plurality of gas supply pipes, and
    wherein the controller is configured to be capable of controlling the inert gas supplier to supply the inert gas into a gas supply pipe on an upstream side and a gas supply pipe on a downstream side of a gas supply pipe to which a pressure detector for which blockage has been determined belongs.

10. The substrate processing apparatus of claim 9, wherein the gas supply system comprises an exhauster configured to evacuate an inside of the plurality of gas supply pipes, and wherein the controller is configured to be capable of controlling the exhauster and the inert gas supplier to alternately perform:
evacuating the gas supply pipe on the upstream side and the gas supply pipe on the downstream side of the gas supply pipe to which the pressure detector for which blockage has been determined belongs; and
supplying the inert gas into the gas supply pipe on the upstream side and the gas supply pipe on the downstream side of the gas supply pipe to which the pressure detector for which blockage has been determined belongs.

11. The substrate processing apparatus of claim 1, wherein the controller is configured to be capable of controlling a gas pipe heater located on a downstream side of one or more gas supply pipes for which blockage has been determined by a pressure detector among the plurality of pressure detectors, to raise temperature of the gas pipe heater.

12. The substrate processing apparatus of claim 1, wherein the controller is configured to be capable of controlling a plurality of gas pipe heaters to, when raising temperature of the plurality of gas pipe heaters, raise temperature of a gas pipe heater corresponding to a pressure detector for which blockage has been determined and temperature of a gas pipe heater located on a downstream side of the pressure detector to a substantially constant temperature.

13. The substrate processing apparatus of claim 1, wherein the controller is configured to be capable of controlling a plurality of gas pipe heaters to, when raising temperature of the plurality of gas pipe heaters, raise heating temperature from a gas pipe heater, which corresponds to a pressure detector for which blockage has been determined, toward a downstream of the plurality of gas supply pipes.

14. The substrate processing apparatus of claim 1, wherein the controller is configured to be capable of notifying at least one selected from the group of the display device and a host device of information that a portion of the plurality of supply pipes provided with a pressure detector, for which blockage has been determined, is to be replaced.

15. The substrate processing apparatus of claim 14, wherein the controller is configured to be capable of controlling a plurality of gas pipe heaters to lower temperature of a gas pipe heater provided on a gas supply pipe to which a pressure detector for which blockage has been determined belongs, while maintaining temperature of gas pipe heaters provided on an upstream side and a downstream side of the gas supply pipe to which the pressure detector for which the blockage has been determined belongs.

16. The substrate processing apparatus of claim 14, wherein the controller is configured to notify the display device of a position of the portion of the plurality of gas supply pipes to be replaced.

17. A method of manufacturing a semiconductor device by a substrate processing apparatus comprising:
a reaction container configured to accommodate a substrate;
an exhaust pipe configured to exhaust an atmosphere inside the reaction container;
a gas supplier configured to supply a process gas to the substrate;
a gas supply system comprising:
a plurality of valves;
a plurality of gas supply pipes kept in fluid communication with the gas supplier and configured to supply the process gas into the reaction container, each of the plurality of gas supply pipes being installed between a pair of valves among the plurality of valves; and
a plurality of pressure detectors provided on the plurality of gas supply pipes, respectively, each of the plurality of pressure detectors being disposed between the pair of valves among the plurality of valves; and
a display device,
wherein the method comprises:
determining whether a measurement result measured by plurality of pressure detectors is higher than a predetermined value;
performing at least one selected from the group of:
in response to determining that the measurement result is higher than the predetermined value, determining that blockage occurs on one or more gas supply pipes among the plurality of gas supply pipes, which are installed at a downstream side of the plurality of pressure detectors; and
in response to determining that the measurement result is lower than the predetermined value, determining that blockage occurs on one or more gas supply pipes among the plurality of gas supply pipes, which are installed at an upstream side of the plurality of pressure detectors;
eliminating the blockage occurring on the downstream or upstream side of the plurality of pressure detectors;
loading the substrate into the reaction container; and
supplying the process gas from the plurality of gas supply pipes of the gas supply system to the substrate via the gas supplier,
wherein the method further comprises displaying information about a response program on the display device based on one or more measurement results measured by the plurality of pressure detectors.

18. A substrate processing method by a substrate processing apparatus comprising:
a reaction container configured to accommodate a substrate;
an exhaust pipe configured to exhaust an atmosphere inside the reaction container;
a gas supplier configured to supply a process gas to the substrate; and
a gas supply system comprising:
a plurality of valves;
a plurality of gas supply pipes kept in fluid communication with the gas supplier and configured to supply the process gas into the reaction container, each of the plurality of gas supply pipes being installed between a pair of valves among the plurality of valves; and
a plurality of pressure detectors provided on the plurality of gas supply pipes, respectively, each of the plurality of pressure detectors being disposed between the pair of valves among the plurality of valves; and
a display device,
wherein the substrate processing method comprises:
determining whether a measurement result measured by plurality of pressure detectors is higher than a predetermined value;
performing at least one selected from the group of:
in response to determining that the measurement result is higher than the predetermined value, determining that blockage occurs on one or more gas supply pipes among the plurality of gas supply pipes, which are installed at a downstream side of the plurality of pressure detectors; and
in response to determining that the measurement result is lower than the predetermined value, determining that blockage occurs on one or more gas supply pipes among the plurality of gas supply pipes, which are installed at an upstream side of the plurality of pressure detectors;

eliminating the blockage occurring on the downstream or upstream side of the plurality of pressure detectors;

loading the substrate into the reaction container; and supplying the process gas from the plurality of gas supply pipes of the gas supply system to the substrate via the gas supplier, wherein the method further comprises displaying information about a response program on the display device based on one or more measurement results measured by the plurality of pressure detectors.

19. A non-transitory computer-readable recording medium storing a program that causes, by a computer, a substrate processing apparatus to perform a process, the substrate processing apparatus comprising:

a reaction container configured to accommodate a substrate;

an exhaust pipe configured to exhaust an atmosphere inside the reaction container;

a gas supplier configured to supply a process gas to the substrate; and a gas supply system comprising:

a plurality of valves;

a plurality of gas supply pipes kept in fluid communication with the gas supplier and configured to supply the process gas into the reaction container, each of the plurality of gas supply pipes being installed between a pair of valves among the plurality of valves; and a plurality of pressure detectors provided on the plurality of gas supply pipes, respectively, each of the plurality of pressure detectors being disposed between the pair of valves among the plurality of valves; and a display device, where the process comprises:

determining whether a measurement result measured by plurality of pressure detectors is higher than a predetermined value;

performing at least one selected from the group of:

in response to determining that the measurement result is higher than the predetermined value, determining that blockage occurs on one or more gas supply pipes among the plurality of gas supply pipes, which are installed at a downstream side of the plurality of pressure detectors; and in response to determining that the measurement result is lower than the predetermined value, determining that blockage occurs on one or more gas supply pipes among the plurality of gas supply pipes, which are installed at an upstream side of the plurality of pressure detectors;

eliminating the blockage occurring on the downstream or upstream side of the one of the plurality of pressure detectors;

loading the substrate into the reaction container; and supplying the process gas from the plurality of gas supply pipes of the gas supply system to the substrate via the gas supplier, wherein the process further comprises displaying information about a response program on the display device based on one or more measurement results measured by the plurality of pressure detectors.

* * * * *